United States Patent
Coffey

(10) Patent No.: US 9,236,728 B2
(45) Date of Patent: *Jan. 12, 2016

(54) POWER SWITCHING ARRANGEMENT

(71) Applicant: CommScope Technologies LLC, Hickory, NC (US)

(72) Inventor: Joseph C. Coffey, Burnsville, MN (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/048,792

(22) Filed: Oct. 8, 2013

(65) Prior Publication Data

US 2014/0192448 A1    Jul. 10, 2014

Related U.S. Application Data

(63) Continuation of application No. 12/576,394, filed on Oct. 9, 2009, now Pat. No. 8,553,382.

(60) Provisional application No. 61/104,169, filed on Oct. 9, 2008.

(51) Int. Cl.
*H02H 7/22* (2006.01)
*H02H 9/00* (2006.01)
*H05K 7/14* (2006.01)

(52) U.S. Cl.
CPC ............... *H02H 7/22* (2013.01); *H02H 9/004* (2013.01); *H05K 7/1457* (2013.01)

(58) Field of Classification Search
CPC ...................................................... H02H 7/22
See application file for complete search history.

(56) References Cited

U.S. PATENT DOCUMENTS

| 3,590,325 | A | 6/1971 | McMillen et al. |
| 5,012,381 | A | 4/1991 | Elliott et al. |
| 5,204,800 | A | 4/1993 | Wasney |
| 5,546,282 | A | 8/1996 | Hill et al. |
| 5,689,406 | A | 11/1997 | Wood et al. |
| 5,699,241 | A | 12/1997 | Fujikawa |
| 6,038,126 | A | 3/2000 | Weng |

(Continued)

FOREIGN PATENT DOCUMENTS

| CH | 300420 | 10/1954 |
| DE | 36 28 130 C1 | 11/1987 |

(Continued)

OTHER PUBLICATIONS

International Search Report and Written Opinion mailed Feb. 10, 2010.

(Continued)

*Primary Examiner* — Rexford Barnie
*Assistant Examiner* — Terrence Willoughby
(74) *Attorney, Agent, or Firm* — Merchant & Gould P.C.

(57) ABSTRACT

A circuit protection system for a power panel is disclosed. The circuit protection system includes a transistor connected in a channel of a power panel, the transistor connected between return connections of a load and a return path, and the power panel including a plurality of channels connected to the load. The circuit protection system also includes control circuitry electrically connected in parallel with the transistor, the control circuitry configured to selectively activate the transistor to allow current to pass through the transistor based on an observed voltage across the transistor.

23 Claims, 43 Drawing Sheets

(56) References Cited

U.S. PATENT DOCUMENTS

| | | | |
|---|---|---|---|
| 6,067,023 | A | 5/2000 | Bendikas |
| 6,075,698 | A | 6/2000 | Hogan et al. |
| 6,160,699 | A | 12/2000 | Gibson et al. |
| 6,301,133 | B1 | 10/2001 | Cuadra et al. |
| 6,331,933 | B1 | 12/2001 | Rumney |
| 6,421,215 | B1 | 7/2002 | Bushue |
| 6,456,203 | B1 | 9/2002 | Schomaker et al. |
| 6,496,376 | B1 | 12/2002 | Plunkett et al. |
| 6,501,649 | B2 | 12/2002 | Yanes et al. |
| 6,653,802 | B1 | 11/2003 | Nelson et al. |
| 6,707,256 | B2 | 3/2004 | Brunker et al. |
| 6,719,149 | B2 | 4/2004 | Tomino |
| 6,819,567 | B2 | 11/2004 | Baker et al. |
| 6,873,510 | B2 | 3/2005 | Schomaker et al. |
| 7,005,996 | B2 | 2/2006 | Cabrera et al. |
| 7,126,803 | B2 | 10/2006 | Schomaker et al. |
| 7,190,093 | B2 | 3/2007 | Bet et al. |
| 7,554,796 | B2 | 6/2009 | Coffey et al. |
| 7,821,753 | B2 | 10/2010 | Evans et al. |
| 2002/0020682 | A1 | 2/2002 | Broome |
| 2004/0113804 | A1 | 6/2004 | Cabrera et al. |
| 2005/0127979 | A1 | 6/2005 | Fan et al. |
| 2006/0044709 | A1 | 3/2006 | Seiersen |
| 2007/0183130 | A1 | 8/2007 | Yamabuchi et al. |
| 2007/0258219 | A1 | 11/2007 | Howes et al. |
| 2008/0136259 | A1 | 6/2008 | Coffey et al. |
| 2009/0020826 | A1 | 1/2009 | Huang et al. |

FOREIGN PATENT DOCUMENTS

| | | |
|---|---|---|
| GB | 2 018 031 A | 10/1979 |
| JP | 2007209184 A | 8/2007 |
| WO | WO 01/72098 A2 | 9/2001 |
| WO | WO 01/76030 A2 | 10/2001 |

OTHER PUBLICATIONS

Hendry Telephone Products document, 2 pages, entitled "Power Distribution, Flexible Series," dated Feb. 1998, pp. 6 and 7.

Hendry Telephone Products document, 2 pages, entitled "Power Distribution, High Density," dated Feb. 1998, pp. 9 and 10.

Hendry Telephone Products document, 2 pages, entitled "Power Distribution, Intelligent," dated Feb. 1998, pp. 17 and 18.

Hendry Telephone Products document, 2 pages, entitled "Power Distribution, Traditional," dated Feb. 1998, pp. 23 and 24.

Telect.com catalog page entitled "Uninterrupted Battery Fuse Panel,", copyright 1999, p. 7.

Telect.com catalog page entitled "Intermediate Fuse Panels," copyright 1999, p. 8.

Telect.com catalog, 2 pages entitled "Circuit Breaker Panel," copyright 1999, pp. 9 and 10.

Telect.com catalog, 2 pages entitled "High Current Circuit Breaker Panel," copyright 1999, pp. 11 and 12.

Telect.com brochure, 2 pages, entitled "Two Fuse Panels in One Rack Space—Intermediate Fuse Panel," dated Jul. 1998.

Printouts from www.telect.com dated Mar. 22, 2000, entitled "Telect, Fuse Panels", 2 pages.

Printouts from www.telect.com dated Mar. 22, 2000, entitled "Telect's Traditional Fuse Panels," 3 pages.

Printouts from www.telect.com dated Mar. 22, 2000, entitled "Telect's Total Front Access Fuse Panels," 2 pages.

Printouts from www.telect.com dated Mar. 22, 2000, entitled "Telect's Intermediate Fuse Panels," 2 pages.

Printouts from www.telect.com dated Mar. 22, 2000, entitled "Telect, Configurable Circuit Breaker Panel," 2 pages.

Printouts from www.telect.com dated Mar. 22, 2000, entitled "Telect's Circuit Breaker Panel," 2 pages.

Printouts from www.telect.com dated Mar. 30, 2000, entitled "Telect's Uninterrupted Battery Fuse Panel," 4 pages.

ADC Telecommunications, Inc., PowerWorx™ Power Distribution Products brochure, dated Aug. 2000.

Drawings from Cisco Systems, Inc. for Stagecoach PDU power distribution panel product, 37 sheets (admitted as prior art as of Jan. 17, 2007).

Hendry Telephone Products power distribution product information pp. 4-9, 12-35, and 38 to 43 (admitted as prior art).

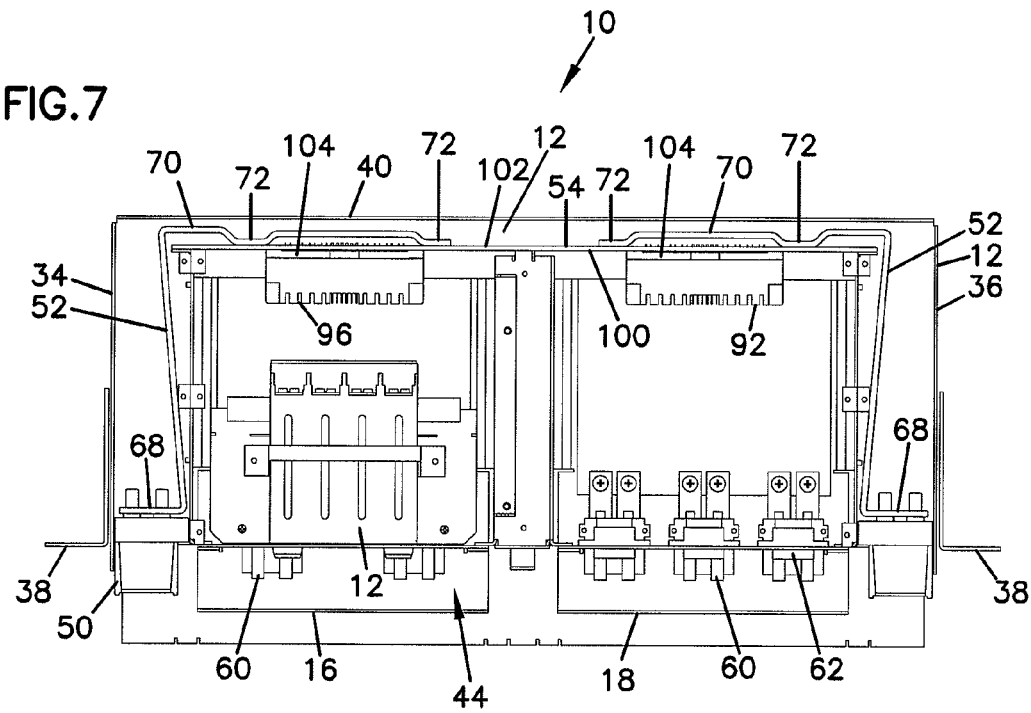
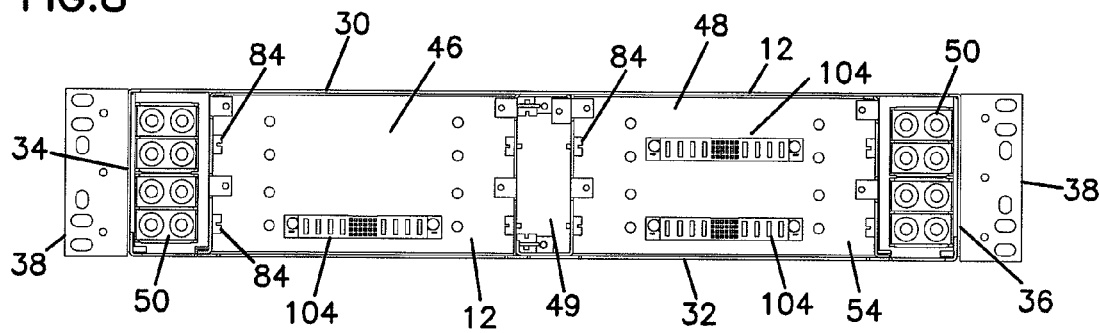

POWER SWITCHING ARRANGEMENT

CROSS REFERENCE TO RELATED APPLICATIONS

This application is a continuation of application Ser. No. 12/576,394, filed Oct. 9, 2009, now U.S. Pat. No. 8,553,382, which application claims priority to U.S. Provisional Patent Application Ser. No. 61/104,169, filed Oct. 9, 2008, which applications are incorporated herein by reference in their entirety.

TECHNICAL FIELD

The present disclosure relates generally to power distribution systems; more specifically, the present disclosure relates to a power switching arrangement.

BACKGROUND

Electrical circuit panels such as power distribution panels typically include a number of different circuit elements such as fuse holders and fuses, circuit breakers, input and output connectors and alarm signal LED's. For safety and other reasons, the electrical circuits of power distribution panels are enclosed within a housing structure. Therefore, the circuit elements listed above have typically been inserted into holes that have been pre-cut or pre-punched into the housing structure, usually on a front or back panel of the housing structure.

These prior circuit panels are fixed and once the holes are formed in the housing, the type and arrangement of the components is limited. In order to manufacture different fixed circuit panels of the prior systems, a circuit panel manufacturer would punch out different patterns of holes in the front or back panels of the housing structure in order to accommodate different arrangements of circuit elements. Significant retooling time and costs are involved for offering different fixed panels. Assembly of the circuit elements is also difficult when the elements are inserted through holes. One solution is described and shown in U.S. Pat. No. 6,456,203.

In addition, such panels are hardwired between the input and output connections, and the fuse and/or breaker locations. In some panels, redundant power connections are provided, controlled by an OR-ing diode including a heat sink. These features can take up significant space within the panel, and can result in current passing through OR-ing diodes associated with inactive power connections.

There is a continued need for improved power distribution panels.

SUMMARY

In accordance with the present disclosure, a power switching arrangement is disclosed. The power switching arrangement includes a protection circuit that selectively switches to allow or block return current in a power distribution unit based on sensed voltages.

According to a first aspect, a circuit protection system for a power panel is disclosed. The circuit protection system includes a transistor connected in a channel of a power panel, the transistor connected between return connections of a load and a return path, and the power panel including a plurality of channels connected to the load. The circuit protection system also includes control circuitry electrically connected in parallel with the transistor, the control circuitry configured to selectively activate the transistor to allow current to pass through the transistor based on an observed voltage across the transistor.

According to a second aspect, a power panel useable in a power distribution system is disclosed. The power panel includes a plurality of channels, with each channel including a supply path and a return path. The return path is electrically connectable through the power panel to return connections of a load. The power panel also includes a circuit protection system associated with one of the plurality of channels. The circuit protection system includes a transistor connected between the return connections and the return path. The circuit protection system also includes control circuitry electrically connected in parallel with the transistor, the control circuitry configured to selectively activate the transistor to allow current to pass through the transistor based on an observed voltage across the transistor.

According to a third aspect, a method of providing circuit protection in a power distribution panel is disclosed. The method includes sensing a voltage above a threshold across a transistor connected between a return path and return connections configured to receive connections to a load. The method further includes, upon sensing the voltage above a threshold across the transistor, activating the transistor with control circuitry connected in parallel with the transistor.

According to a fourth aspect, a power panel is disclosed. The power panel includes a chassis including a top, a bottom, a front, a rear, and two sides. The power panel further includes a plurality of power input connections on the chassis, each power input connection including a source input connection and a return input connection. The power panel also includes a plurality of power output connections on the chassis, each of the power output connections including a source output connection and a return output connection, and each of the power output connections connected to a power input connection through the chassis. The power panel includes a protection circuit connected between at least one of the power output connections and a power input connection. The protection circuit includes a transistor connected between the return output connection and the return input connection, and control circuitry electrically connected in parallel with the transistor, the control circuitry configured to selectively activate the transistor to allow current to pass through the transistor based on an observed voltage across the transistor.

BRIEF DESCRIPTION OF THE DRAWINGS

FIG. 7 is a top view of the power distribution panel of FIG. 1, shown with a top cover portion removed.

FIG. 8 is a front view of the chassis of the power distribution panel of FIG. 1, shown without modules.

DETAILED DESCRIPTION

Figure 1:
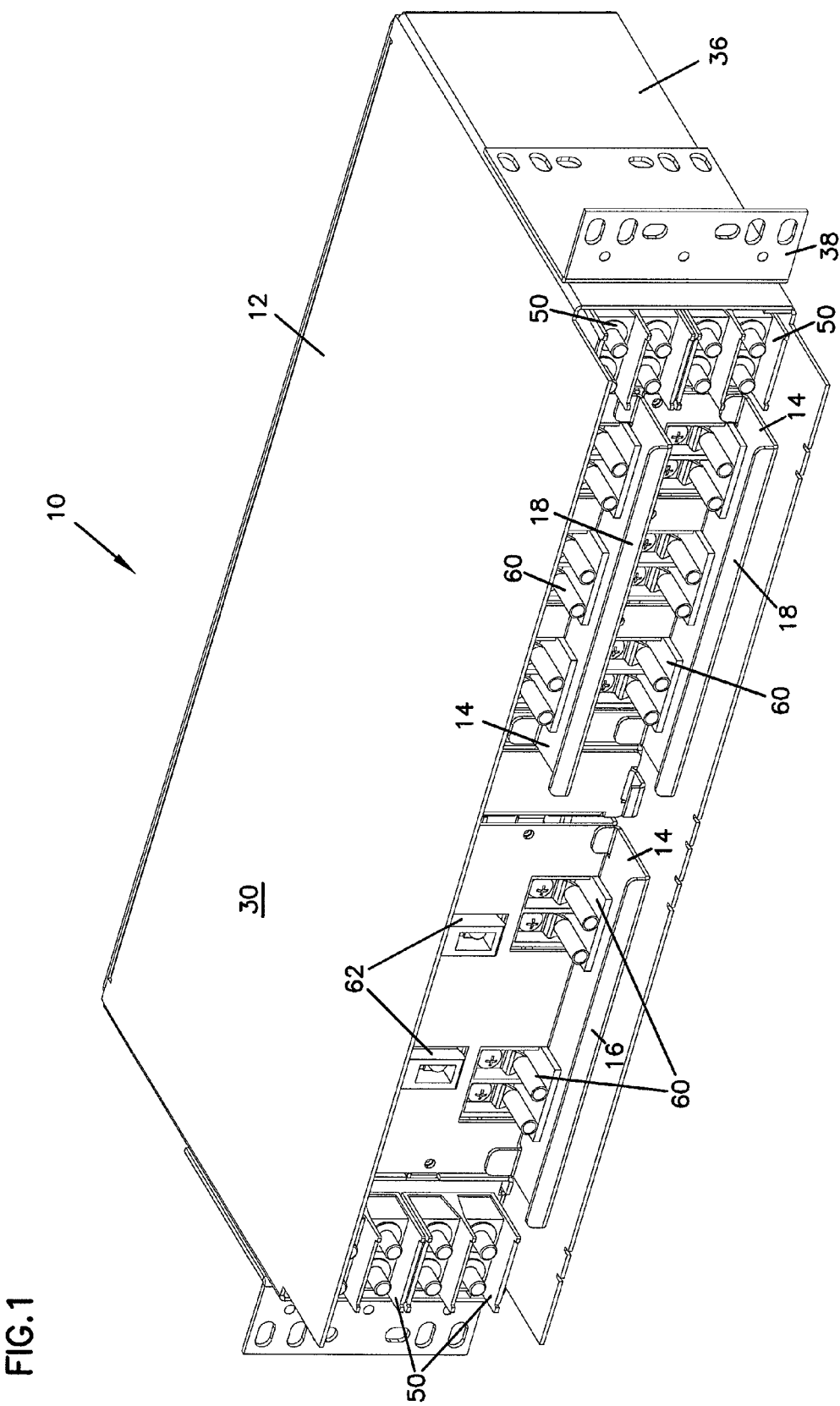
FIG. 1 is a front, top, and right side perspective view of one embodiment of a power distribution panel in accordance with the present invention.
Figure 2:
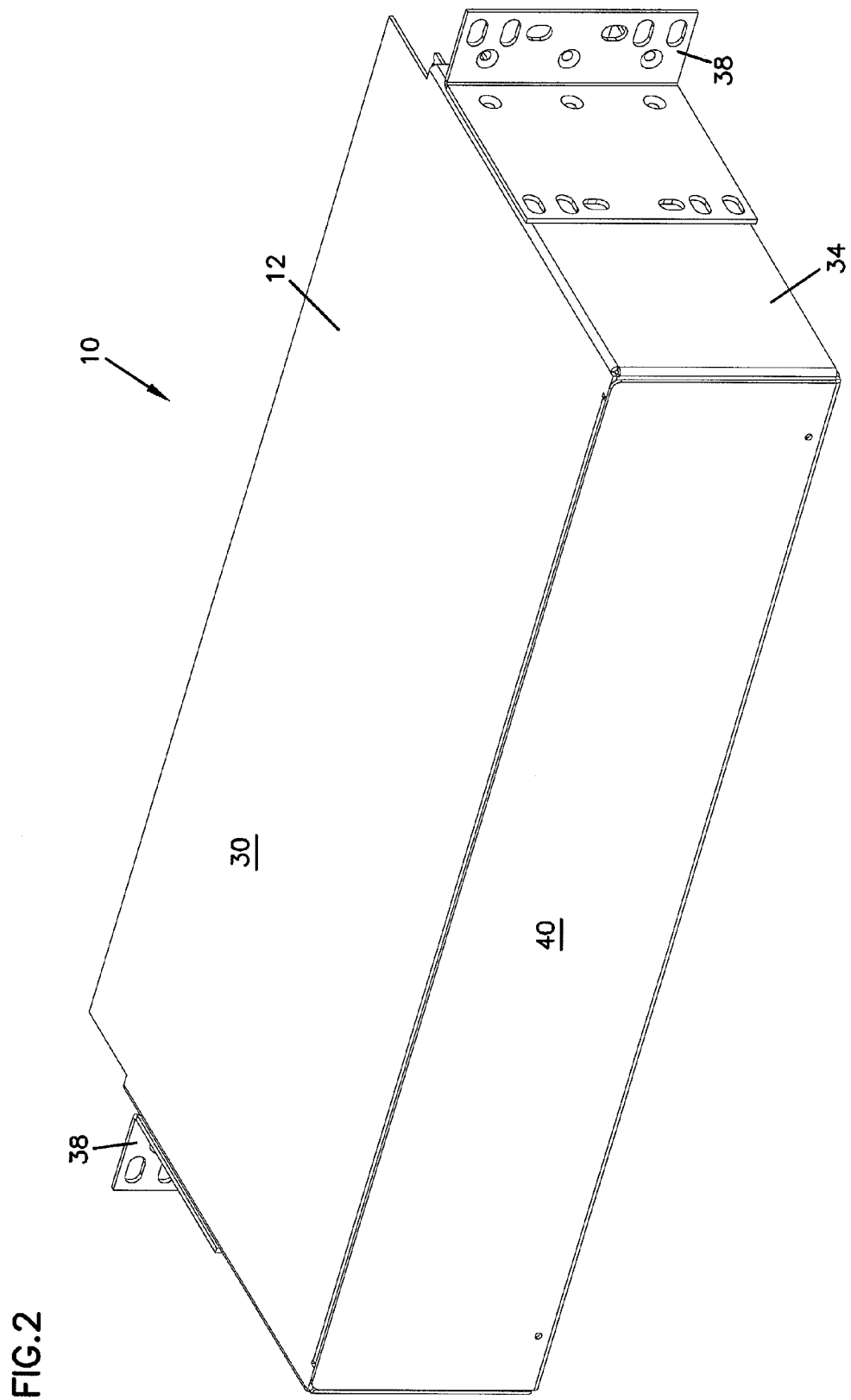
FIG. 2 is a rear, top, and left side perspective view of the power distribution panel of FIG. 1.
Figure 3:
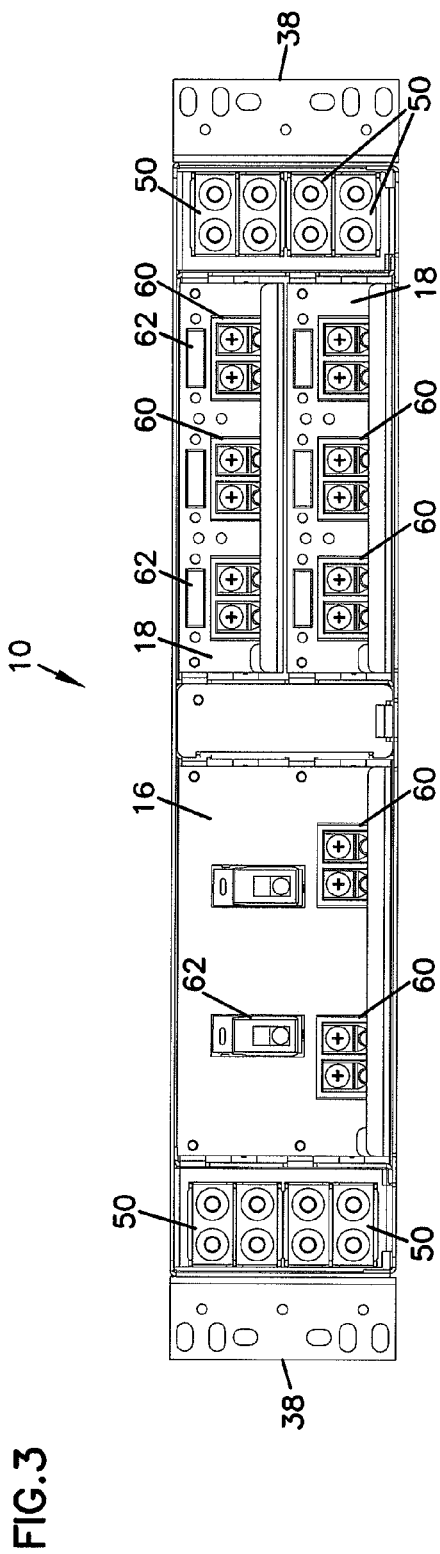
FIG. 3 is a front view of the power distribution panel of FIG. 1.
Figure 4:
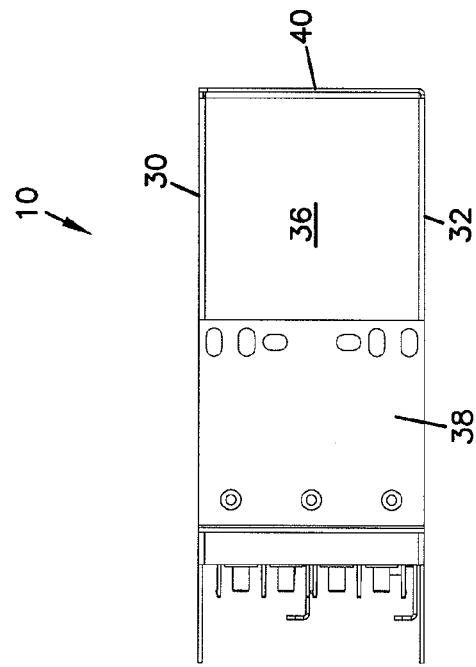
FIG. 4 is a right side view of the power distribution panel of FIG. 1.
Figure 5:
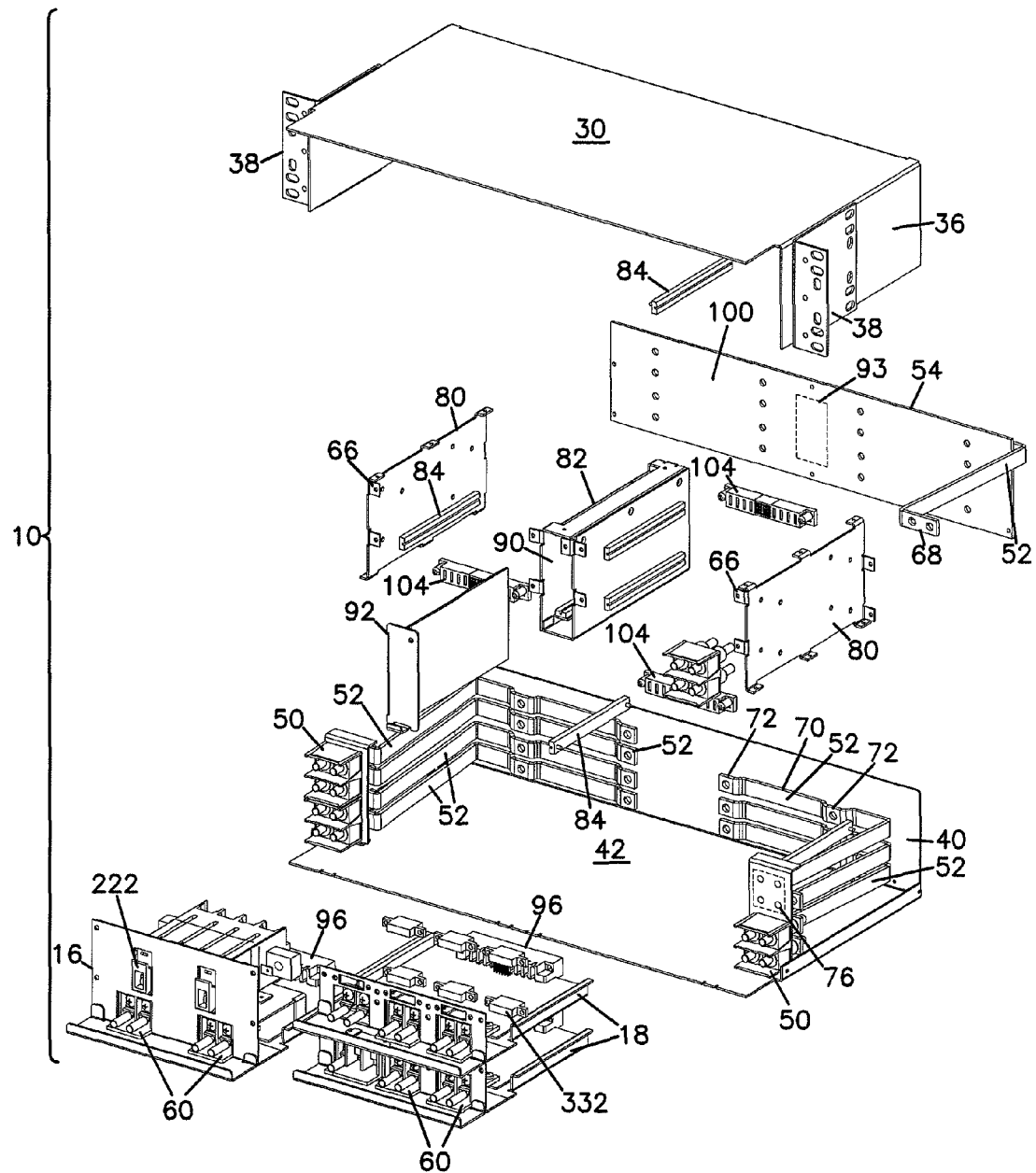
FIG. 5 is an exploded front, top, and right side perspective view of the power distribution panel of FIG. 1.
Figure 6:
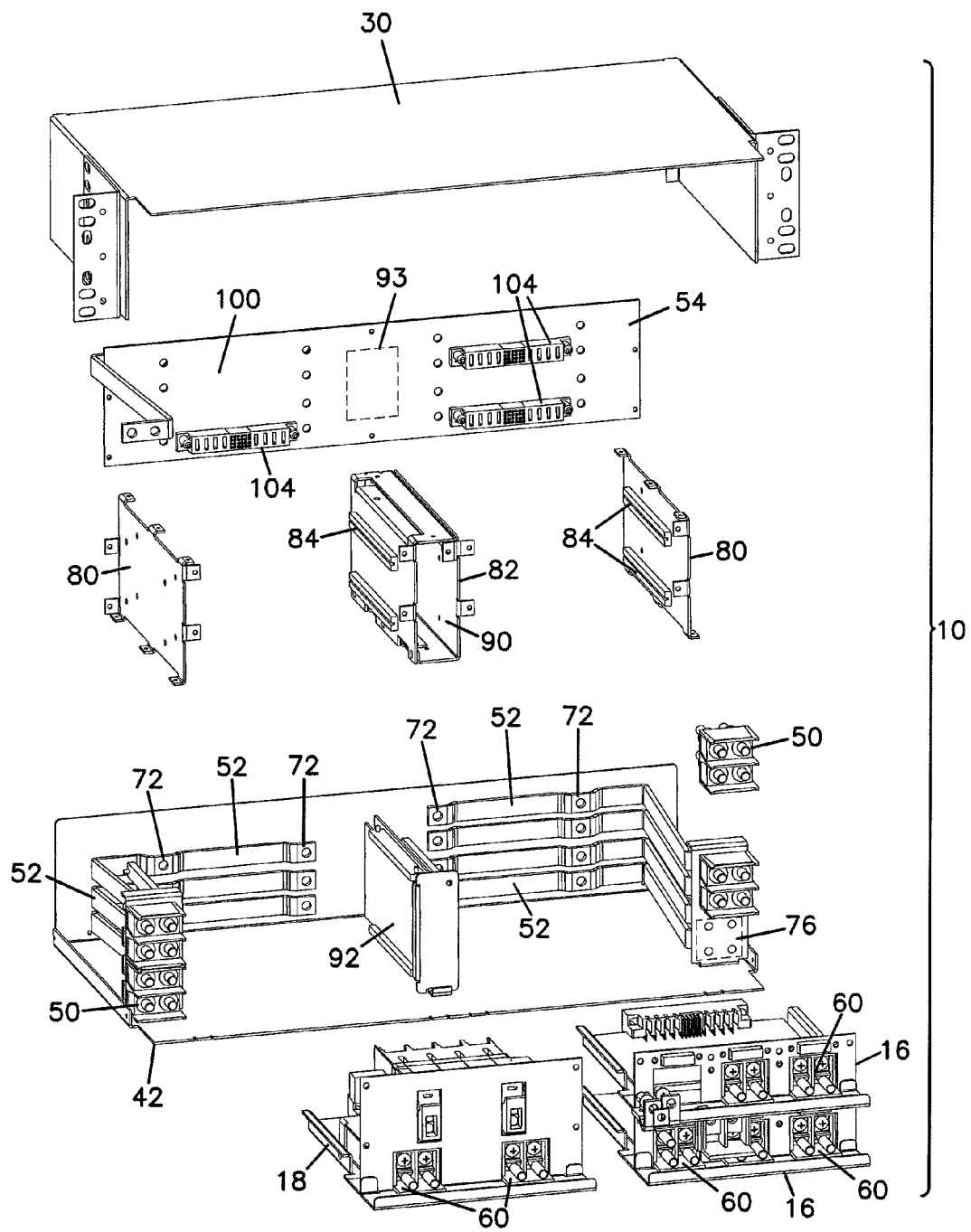
FIG. 6 is an exploded front, top, and left side perspective view of the power distribution panel of FIG. 1.
Figure 10:
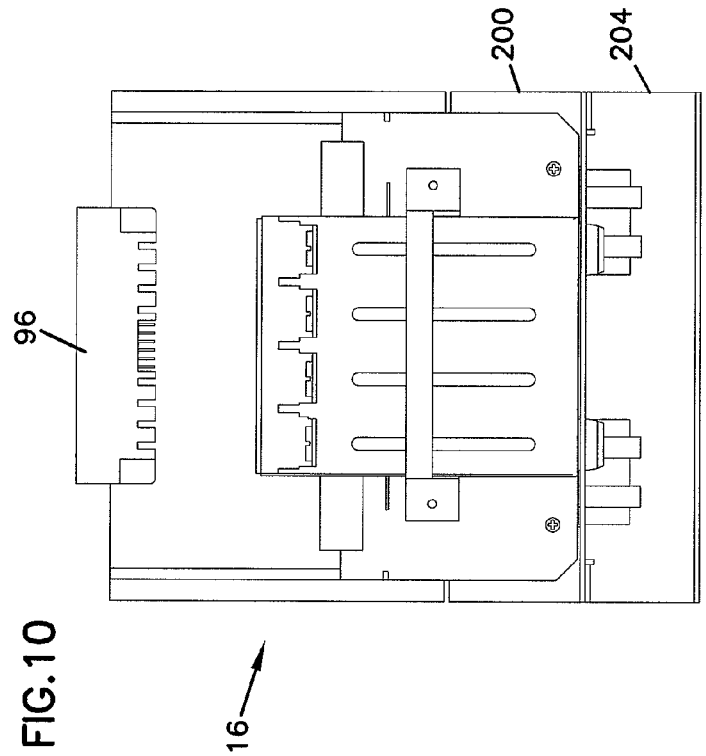
FIG. 10 is a top view of the first circuit module.
Figure 9:
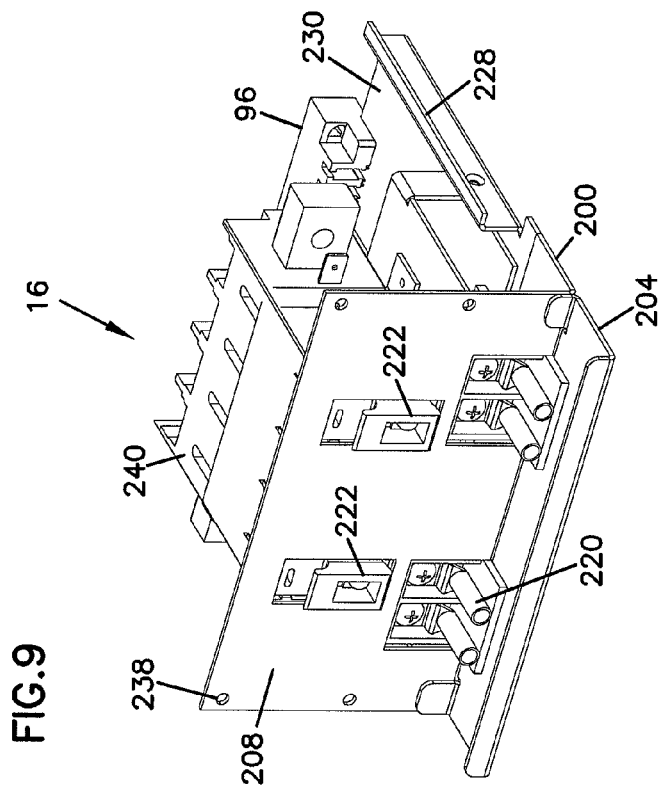
FIG. 9 is perspective view of a first circuit module.
Figure 11:
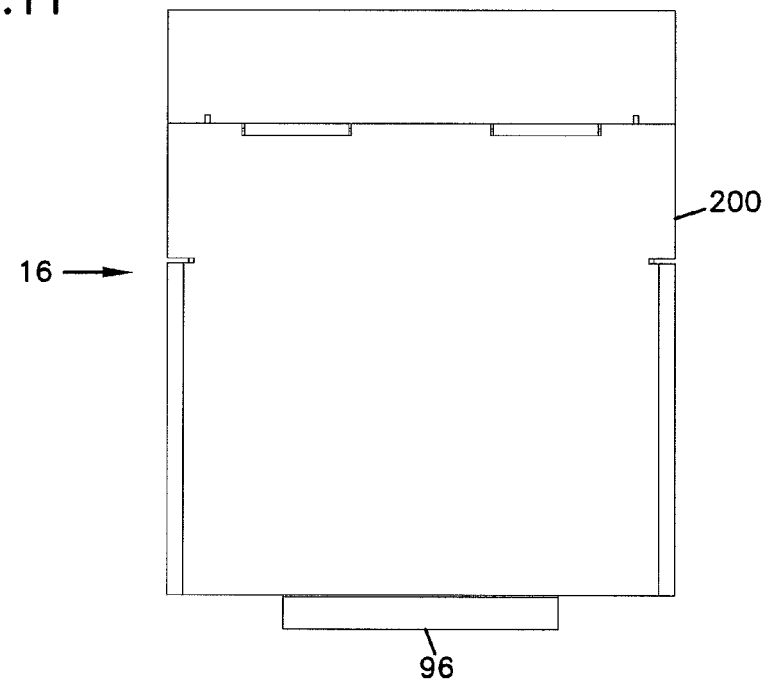
FIG. 11 is a bottom view of the first circuit module.
Figure 12:
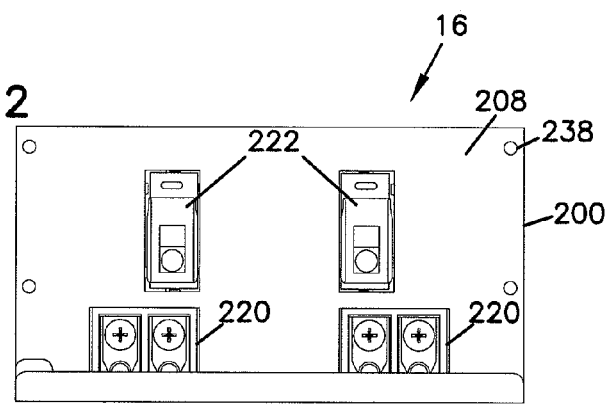
FIG. 12 is a front view of the first circuit module.
Figure 13:
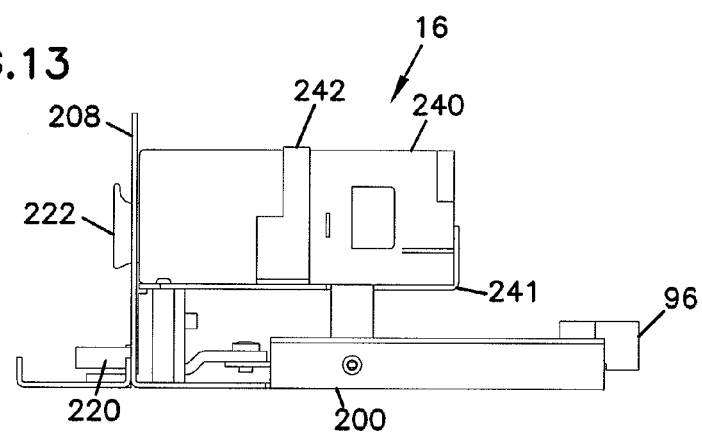
FIG. 13 is a right side view of the first circuit module.
Figure 14:
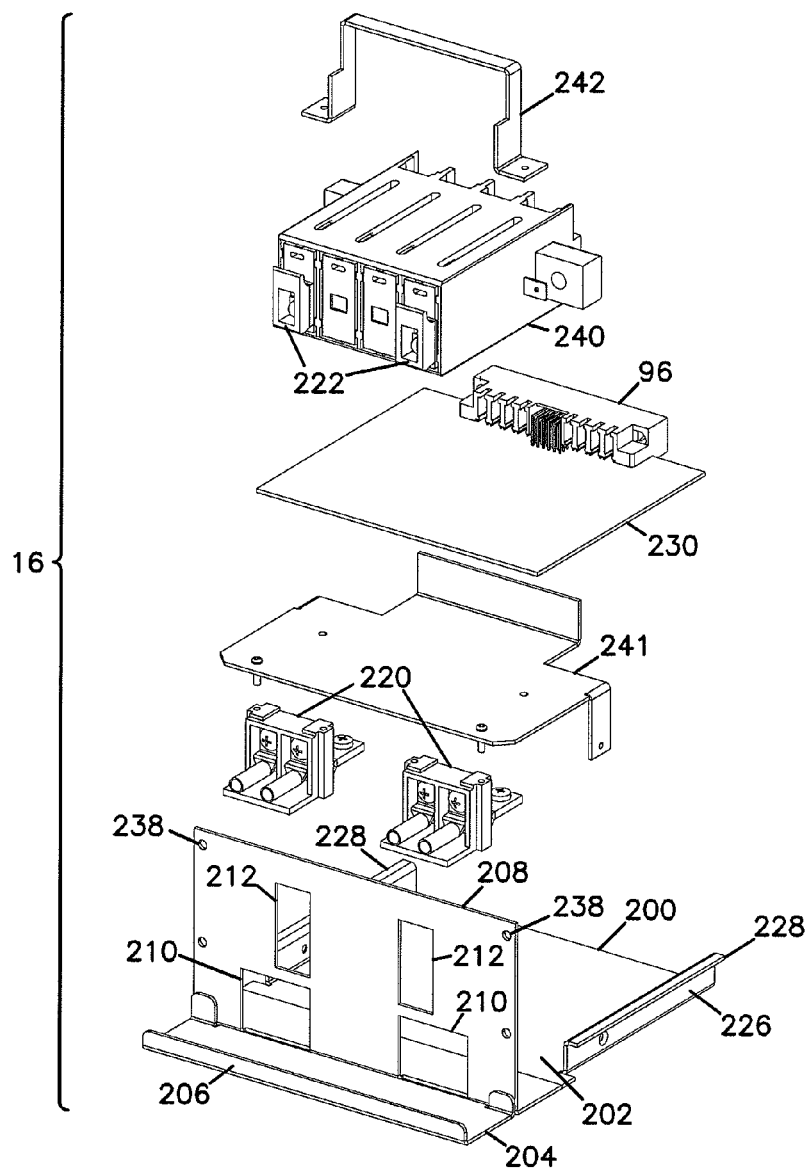
FIG. 14 is an exploded perspective view of the first circuit module.
Figure 15:
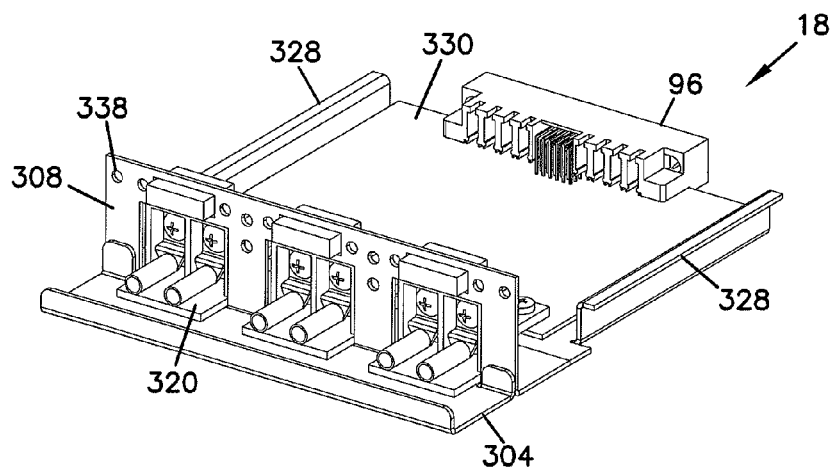
FIG. 15 is a perspective view of a second circuit module.
Figure 16:
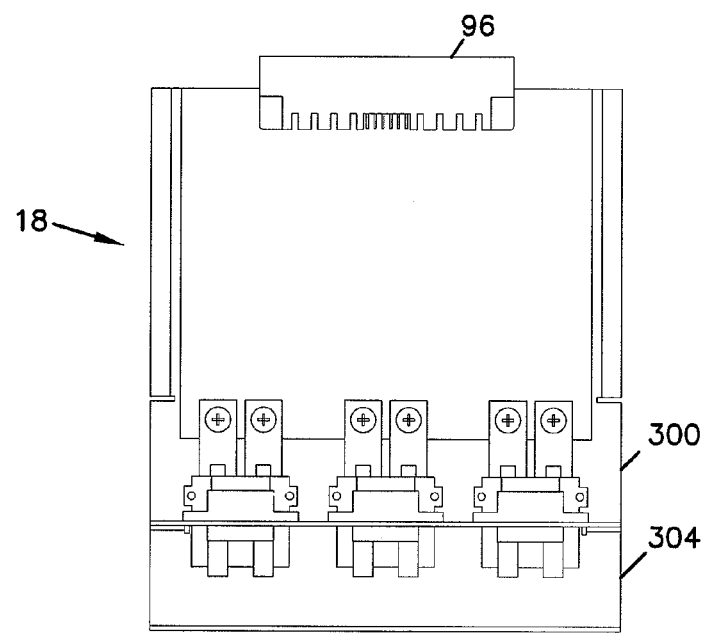
FIG. 16 is a top view of the second circuit module.
Figure 17:
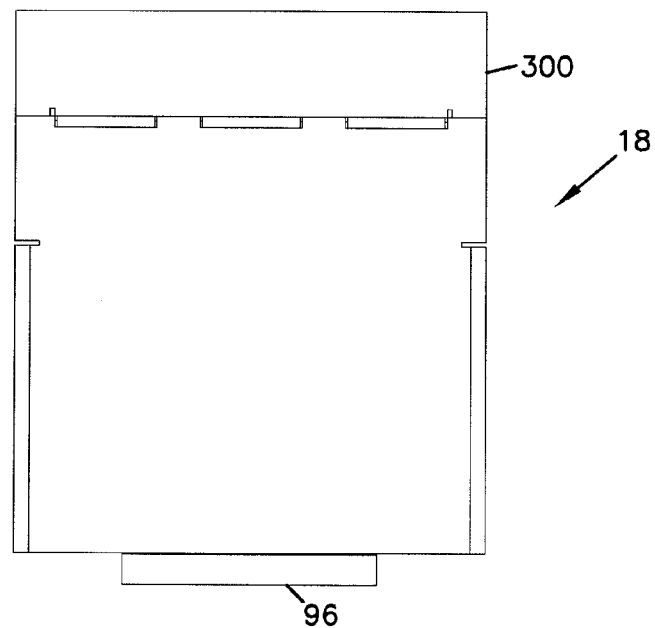
FIG. 17 is a bottom of the second circuit module.
Figure 18:
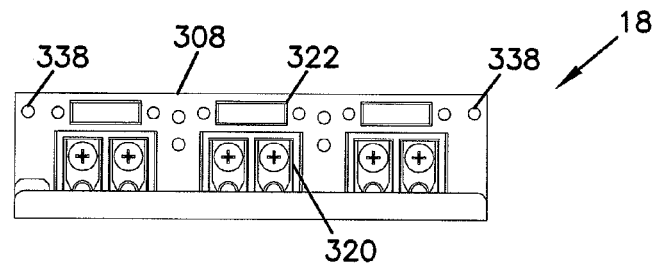
FIG. 18 is a front view of the second circuit module.
Figure 20:
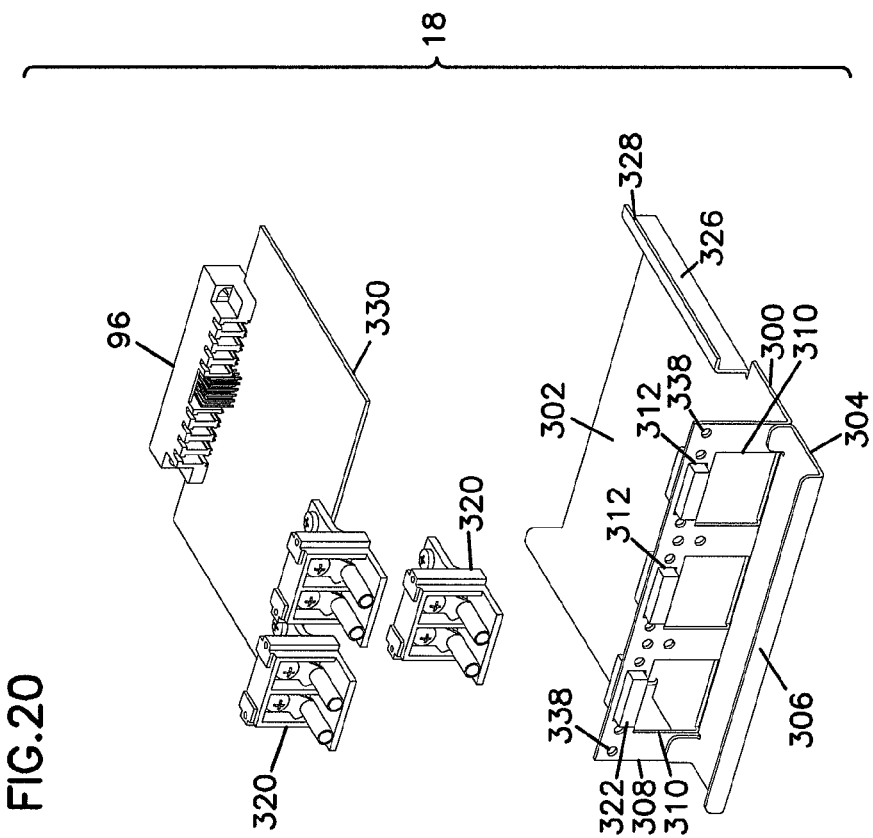
FIG. 20 is an exploded perspective view of the second circuit module.
Figure 19:
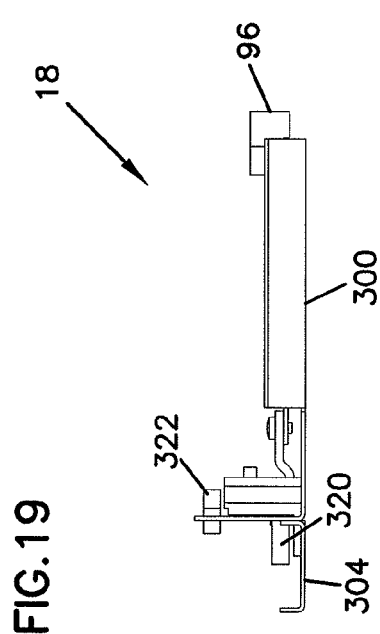
FIG. 19 is a right side view of the second circuit module.
Figure 21:
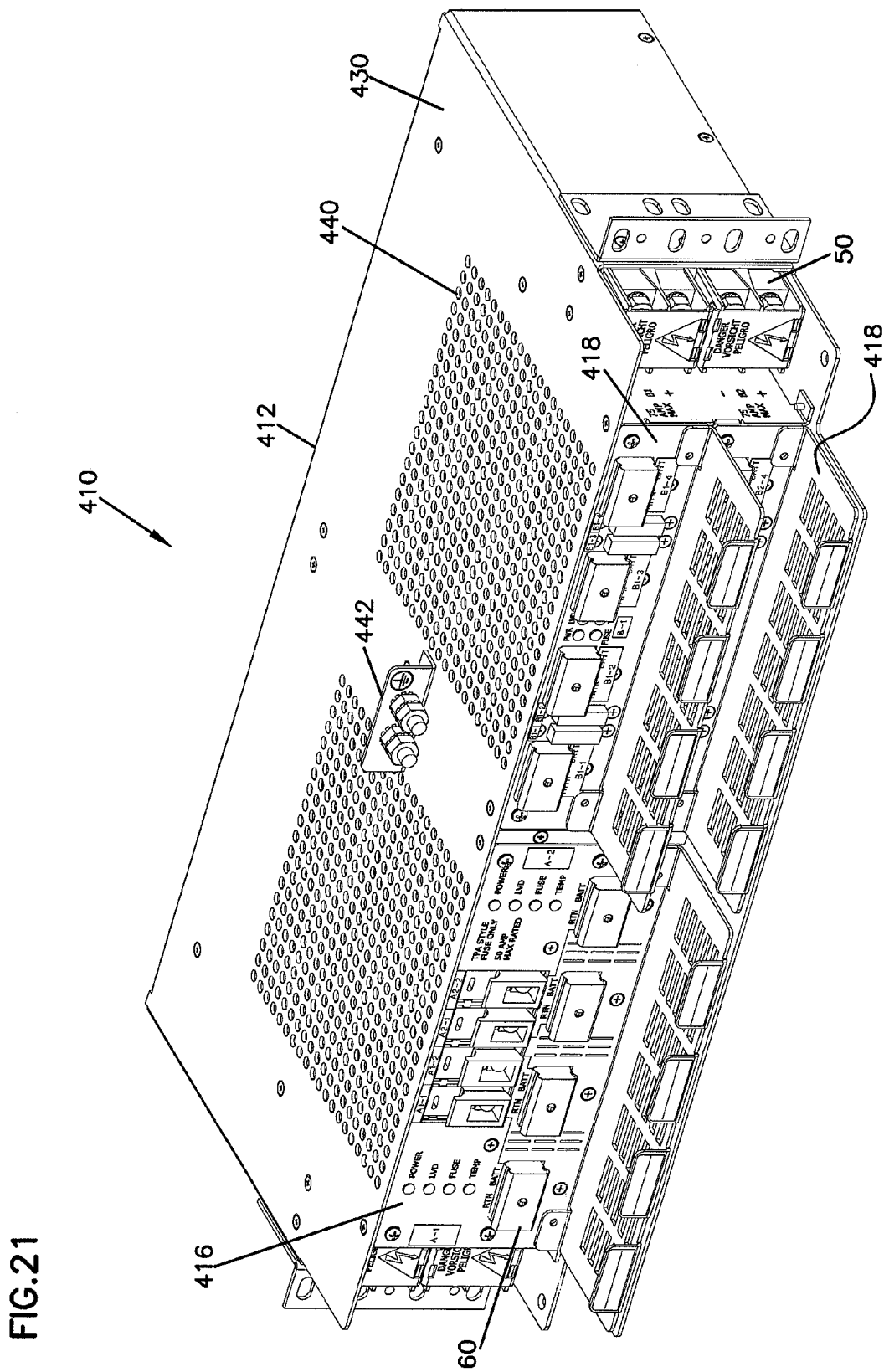
FIG. 21 is a front, top, and right side perspective view of a second embodiment of a power distribution panel in accordance with the present invention.
Figure 22:
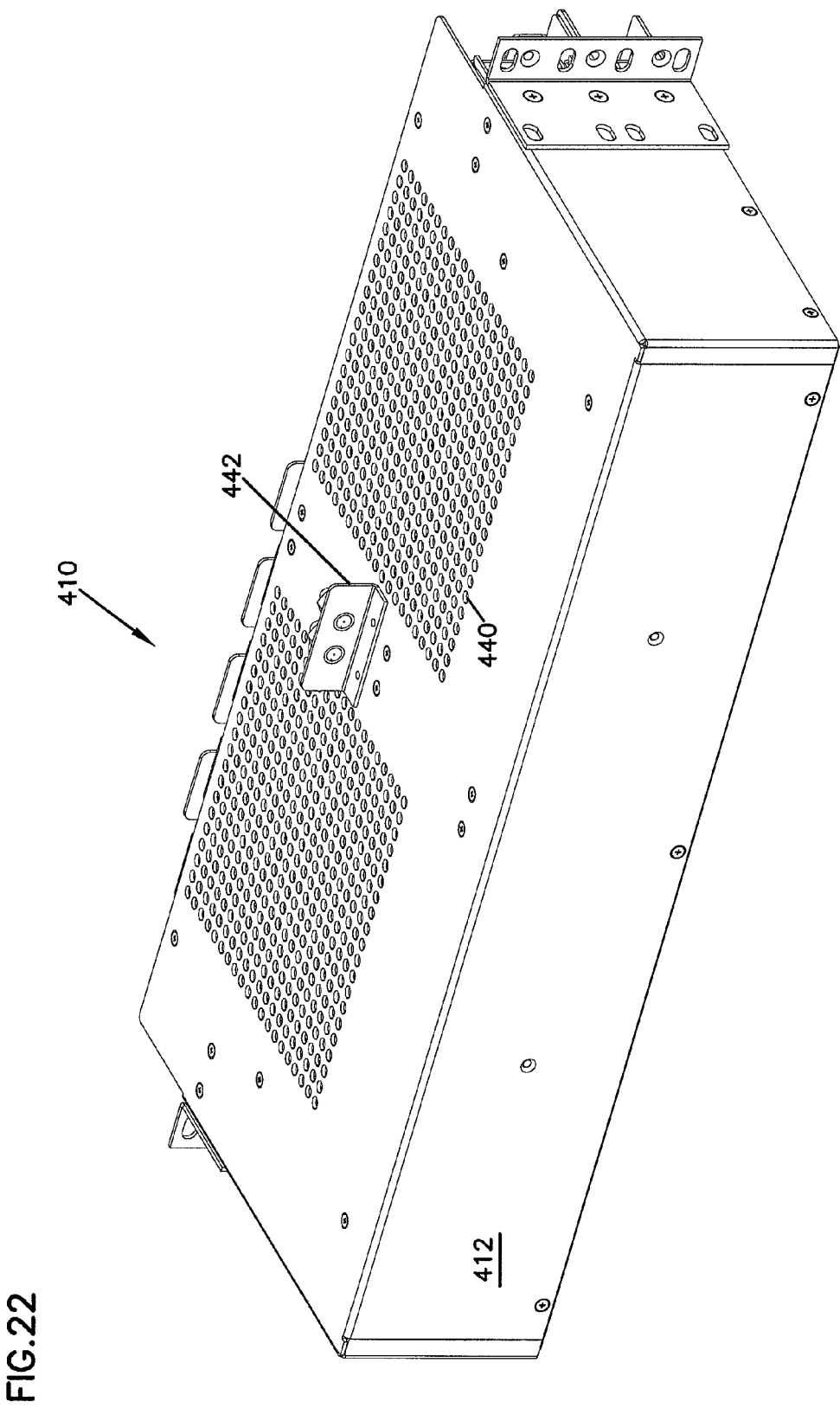
FIG. 22 is a rear, top, and left side perspective view of the power distribution panel of FIG. 21.
Figure 23:
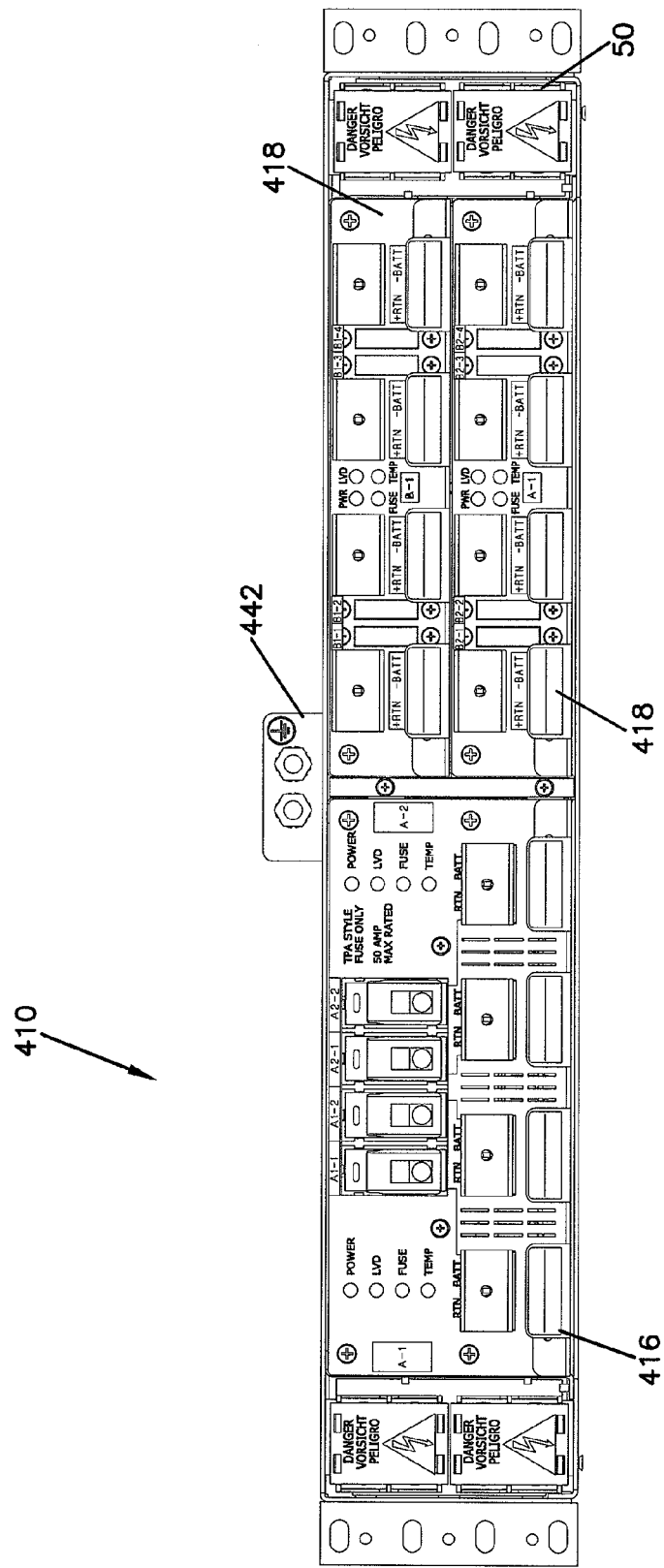
FIG. 23 is a front view of the power distribution panel of FIG. 21.
Figure 24:
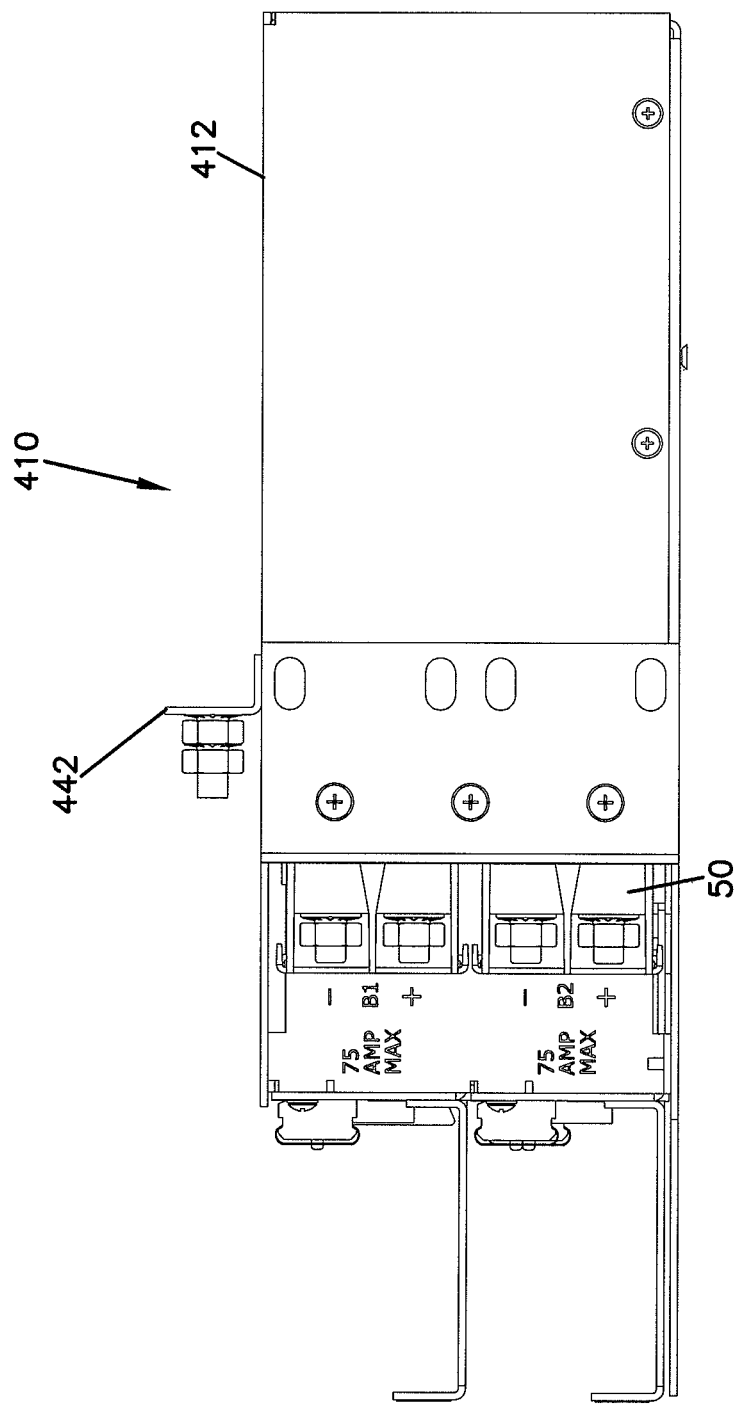
FIG. 24 is a right side view of the power distribution panel of FIG. 21.
Figure 25:
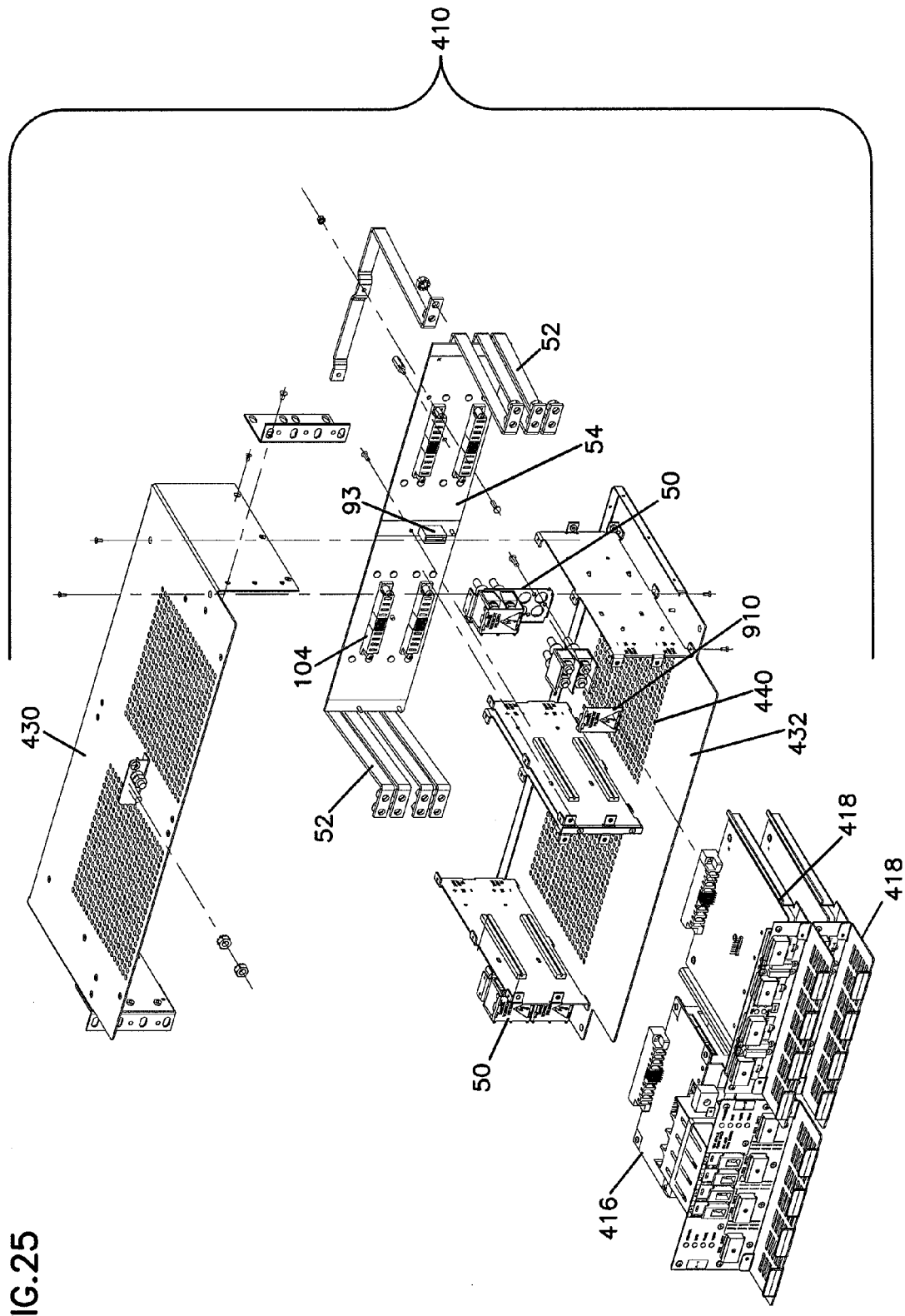
FIG. 25 is an exploded front, top, and right side perspective view of the power distribution panel of FIG. 21.

Referring to FIGS. 1-7, a power distribution system or panel 10 is shown. Power distribution system 10 is a modular design including a panel construction having a chassis 12 and at least one removable circuit module 14. In the illustrated embodiment, one first circuit module 16, and two second circuit modules 18 are shown. First circuit module 16 is positioned in a left side of chassis 12 wherein the first circuit module 16 is of a first design. Two second circuit modules 18 are also shown positioned in a right side of chassis 12 wherein second circuit modules 18 are of a different design from first circuit module 16.

Each circuit module 14 includes circuit distribution components. In the preferred embodiment, the circuit distribution components include a circuit protection device, such as a fuse or a breaker, and a power output arrangement 60. System 10 includes a power input arrangement 50 wherein the circuit protection devices within the modules 14 protect the circuit between the power input arrangement 50 and the power output arrangement 60.

Referring also to FIG. 8, chassis 12 includes a top 30, a spaced apart bottom 32 and opposite sides 34, 36. Adjacent to sides 34, 36 are brackets 38 for mounting to a rack, cabinet, or other telecommunications equipment. Chassis 12 includes a rear 40. Chassis 12 defines an interior 42 having an open front 44. Chassis interior 42 in the illustrated embodiment includes a first module receiving area 46 on a left side of chassis 12, and a second module receiving area 48 on a right side of chassis 12. A central area 49 of chassis 12 is provided. In some embodiments, central area 49 can be used for alarming and/or system management components.

Panel 10 includes power input connectors or terminals 50 connected to internal bus bars 52. A backplane 54, such as a printed circuit board, is positioned adjacent to rear 40 of chassis 12. Bus bars 52 connect input connectors 50 to backplane 54. Modules 16, 18 interconnect with backplane 54 to enable power distribution through modules 16, 18. Each module 16, 18 includes at least one power output connector 60, and a circuit protection device 62, such as a fuse or a breaker.

As shown in FIG. 7, bus bars 52 are generally Z-shaped metallic bars extending from first ends 68 to opposite ends 70. Opposite ends 70 define dual contact points 72 which can be mounted with fasteners (not shown) to backplane 54 to electrically interconnect bus bars 52 and backplane 54. Ends 68 of bus bars 52 are mounted to input terminals 50 at input terminal mounts 76 of chassis 12.

Interior 42 of chassis 12 includes side supports 80 and central support 82. Side supports 80 and central support 82 include a plurality of module guides 84 which define longitudinal slots for receipt of longitudinal rails of each of modules 16, 18. Central support 82 defines an interior for receiving an alarm card 92. Alarm card 92 mounts to alarm card connector 93 on backplane 54. Alarm card 92 is optional if such functionality is employed by panel 10.

Each module 16, 18 includes a rear module connector 96. Backplane 54 includes a front face 100, and opposite rear face 102. Positioned on front face 100 are a plurality of mating connectors 104 for electrically connecting to the module connectors 96.

Referring now in greater detail to FIGS. 9-14, first circuit module 16 is shown. Module 16 includes a frame 200 including a base 202, and a front tray 204 with a front lip 206. A vertical support 208 extends up from base 202 and defines a plurality of openings 210, 212 for output terminal units 220, and fuses 222, respectively. Base 202 also includes sides 226 and longitudinal rails 228. A printed circuit board 230 connects between module connector 96 and the circuit elements including output terminal units 220 and fuses 222. Fuse holder or block 240 with fuses 222 is held in place by a support tray 241 and a strap 242.

Referring now to FIGS. 15-20, one of the second circuit modules 18 is shown. Second module 18 includes a frame 300 including a base 302, a front tray 304, and a front lip 306. A vertical support 308 defines a plurality of openings 310, 312 for output terminal units 320 and fuses 322, respectively. Frame 300 includes sides 326, and longitudinal rails 328. A printed circuit board 330 connects between module connector 96 and the circuit elements including output terminal units 320 and fuses 322.

Modules 16, 18 mount to chassis 12 with fasteners (not shown) through holes 238, 338 in each module, and holes 66 in supports 80 of chassis 12. Front trays 204, 304 are provided for cable management of the power output cables. Front lips 206, 306 also provide a convenient gripping surface.

Because of the modular design for chassis 12 and modules 16, 18, repair or replacement of parts is facilitated. Should upgrades become desirable, new modules can be provided. The modules also allow for distributed control functions, such as in the case of redundant (dual feed) applications. The OR-ing diodes or other controllers can be locally placed on each module. Details regarding possible circuitry used is described below in conjunction with FIGS. 53-54.

Each module includes the desired circuit protection components. Module 16 in the illustrated embodiment is a TPA type fuse. Modules 18 are GMT type fuses. Other fuse types or breakers can be used.

Referring now to FIGS. 21-52, further embodiments of power distribution systems or panels similar to panel 10 are shown. In FIGS. 21-28, a similar panel 410 is shown having a chassis 412, a first circuit module 416, and two second circuit modules 418. Alternatively, panel 410 can hold two first circuit modules 416, or four second circuit modules 418.

Chassis 430 includes air flow openings 440 on a top 430, and on a bottom 432. Chassis 430 further includes a forward facing ground 442 on top 430.

As with panel 10, first circuit module 416 and second circuit modules 418 are removable from chassis 430. Module 416 in the illustrated embodiment is a TPA type fuse with four fuses instead of two as noted in panel 10. Modules 318 are GMT type fuses, each including four fuses, instead of three as noted above for modules 18.

Figure 26:
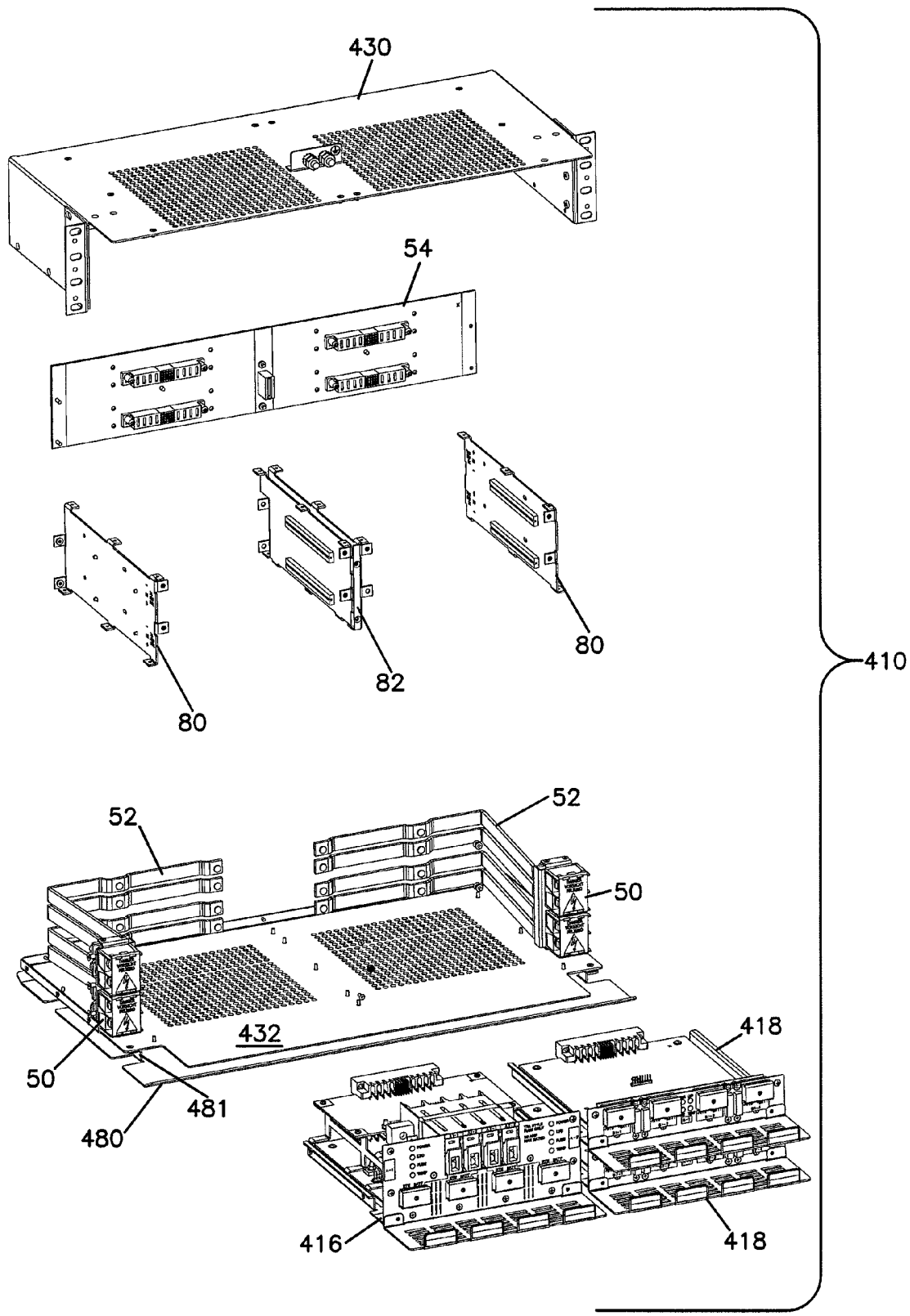
FIG. 26 is an exploded front, top, and left side perspective view of the power distribution panel of FIG. 21.
Figure 27:
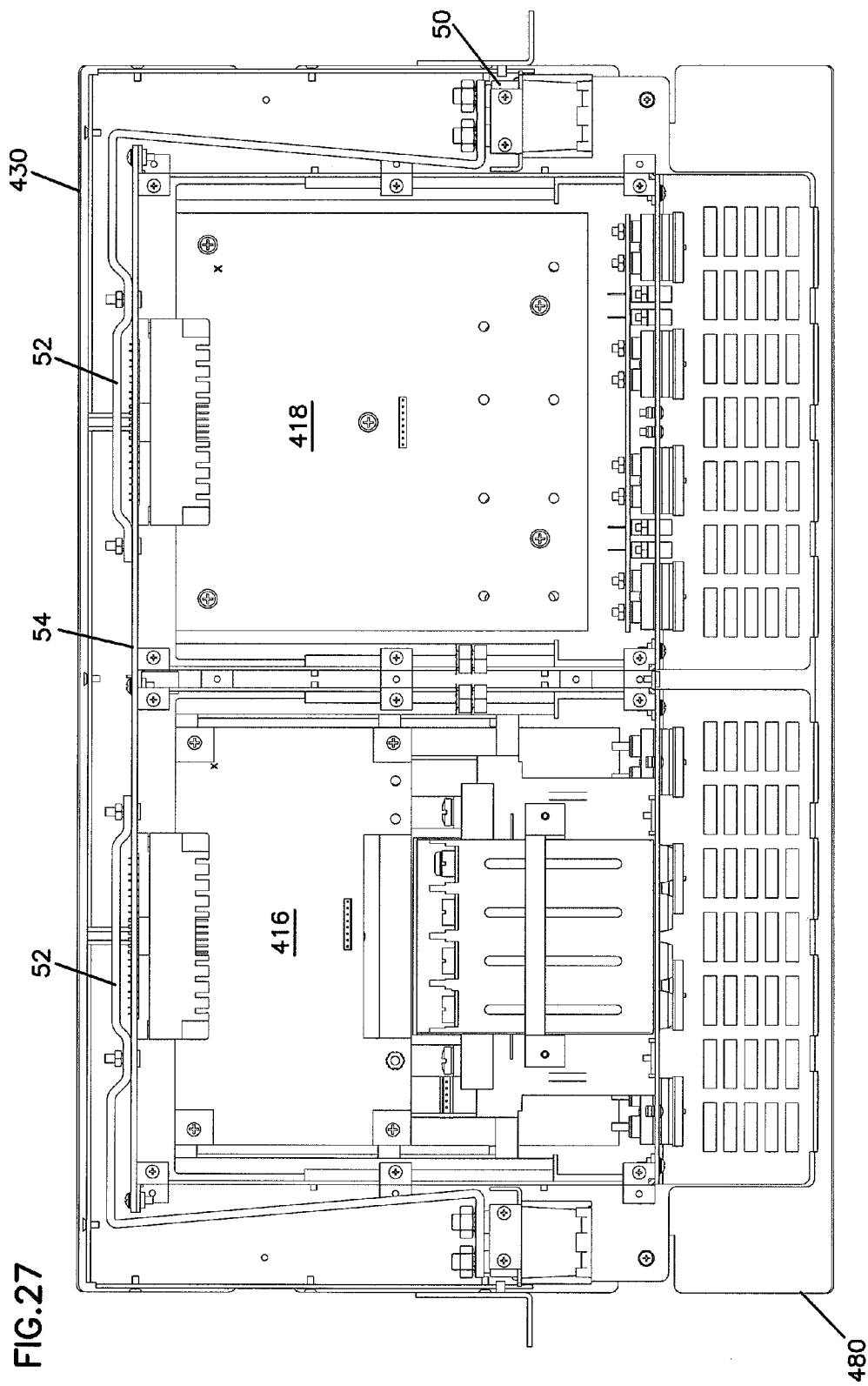
FIG. 27 is a top view of the power distribution panel of FIG. 21, shown with a top cover portion removed.
Figure 28:
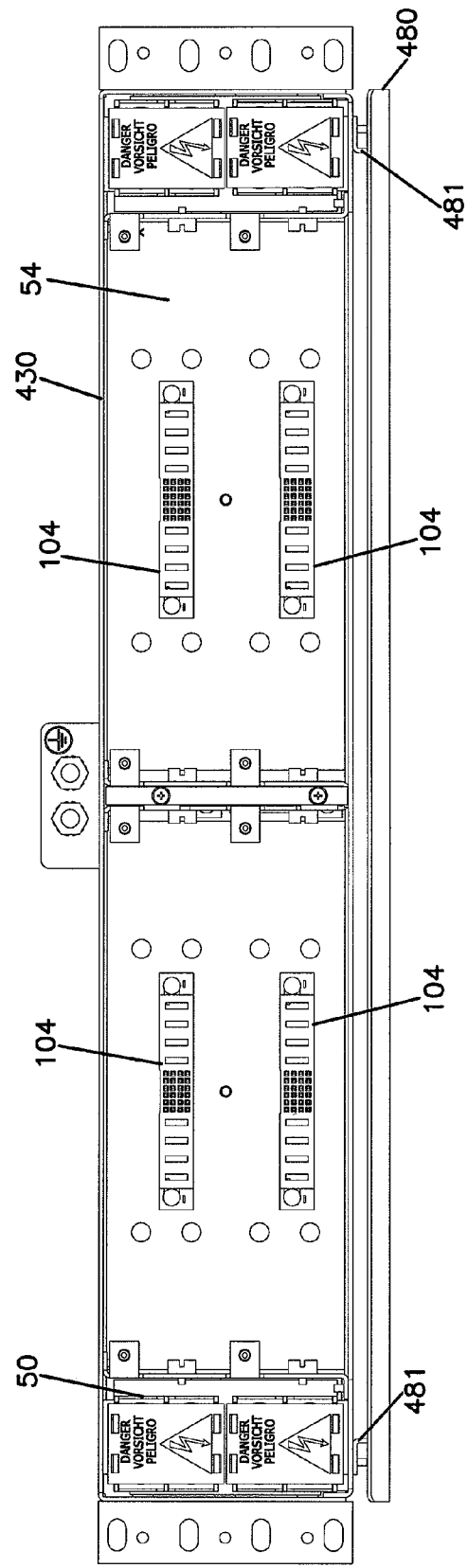
FIG. 28 is a front view of the chassis of the power distribution panel of FIG. 21, shown without modules.

Referring now to FIGS. 26-28, a baffle plate 480 is shown mounted to a bottom 432 of chassis 430. Baffle plate 480 is spaced from bottom 432 by spacers 481 so as to allow airflow communication with openings 440 in bottom 432. Baffle plate 480 also functions as an airflow blocker to block warm air from below chassis 430 from entering into chassis 430, such as from heat emitting equipment mounted below.

Figure 29:
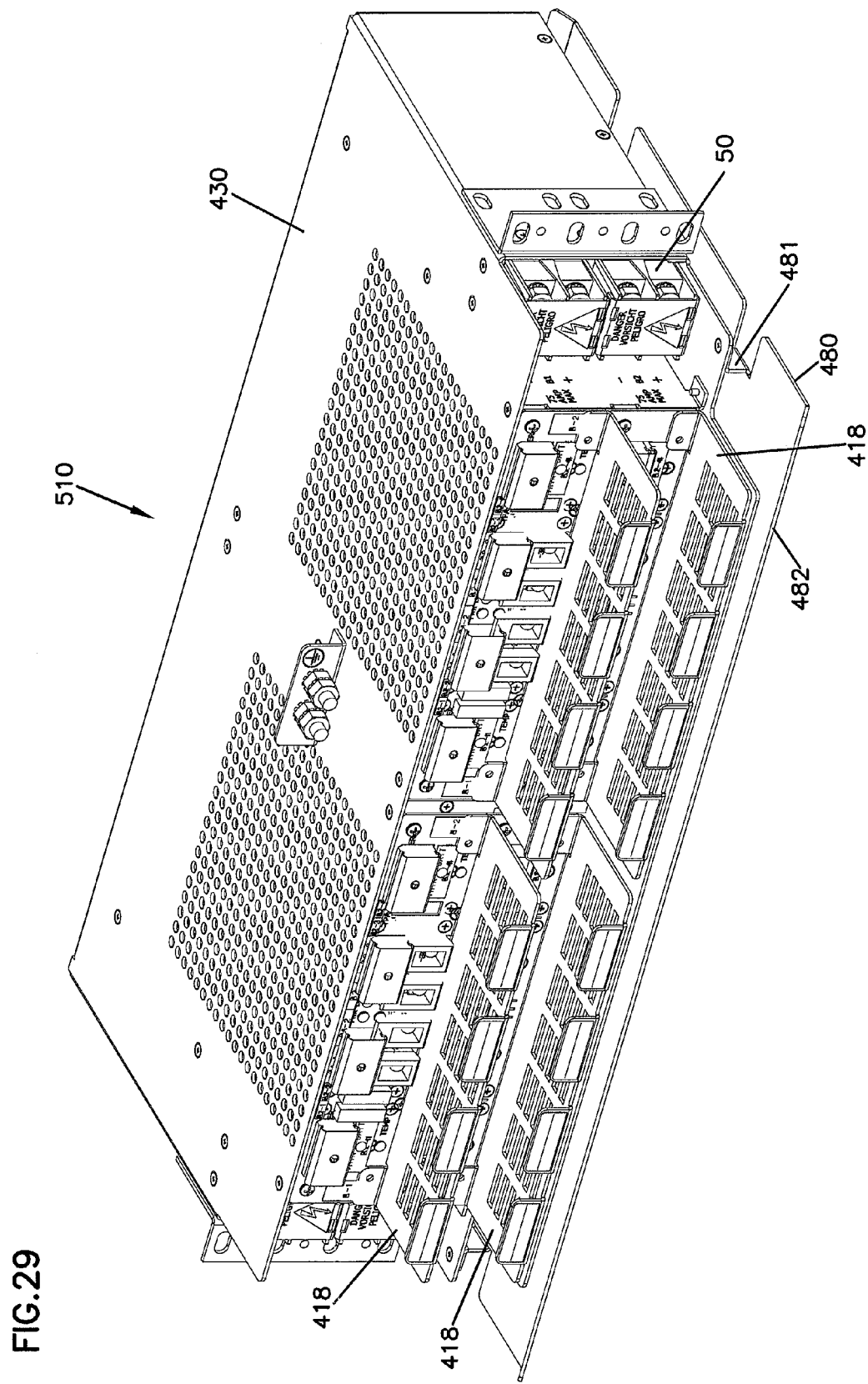
FIG. 29 is a front, top, and right side perspective view of a third embodiment of a power distribution panel in accordance with the present invention.
Figure 30:
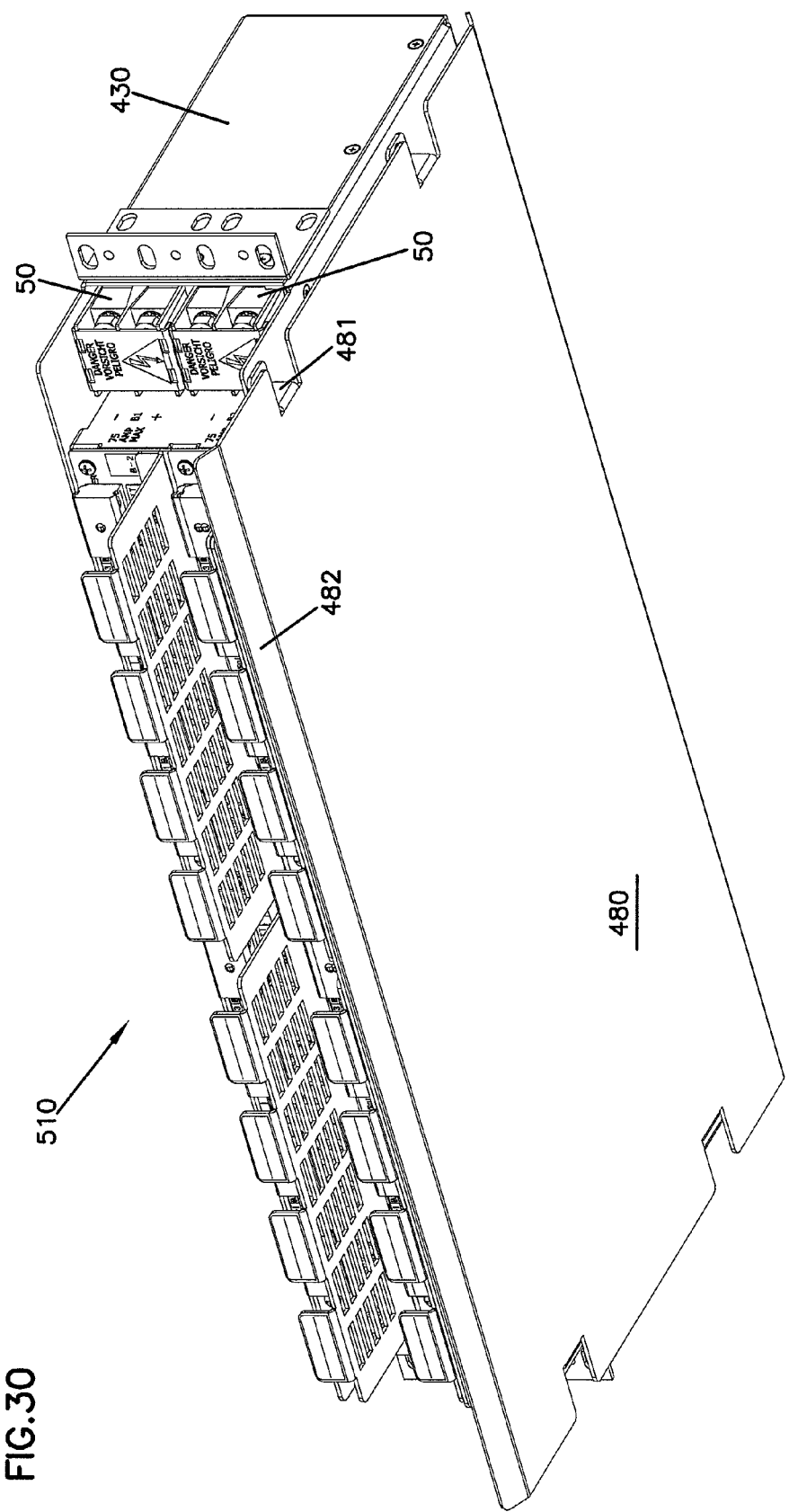
FIG. 30 is a front, bottom, and right side perspective view of the power distribution panel of FIG. 29.
Figure 31:
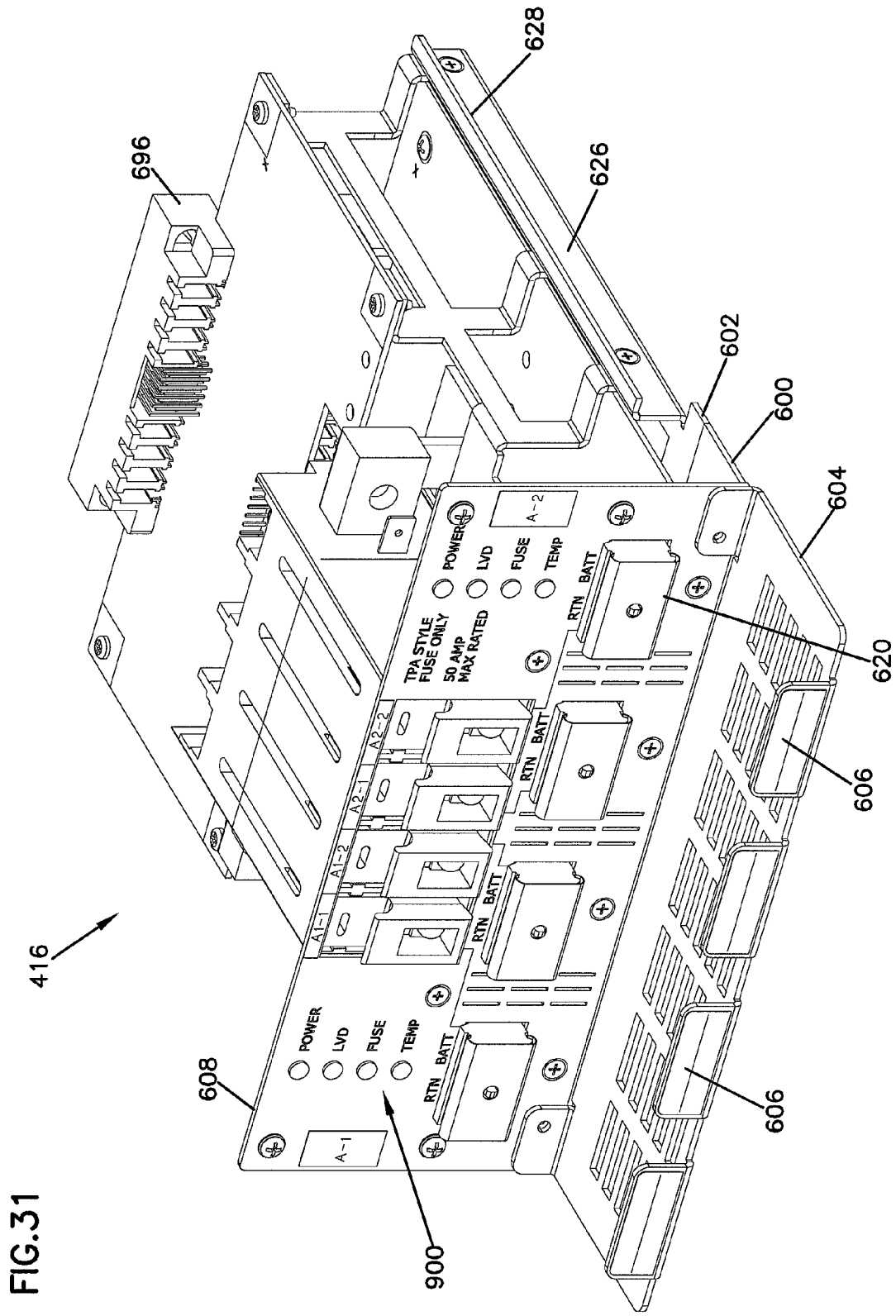
FIG. 31 is a front perspective view of a first circuit module of the power distribution panel of FIG. 21.
Figure 32:
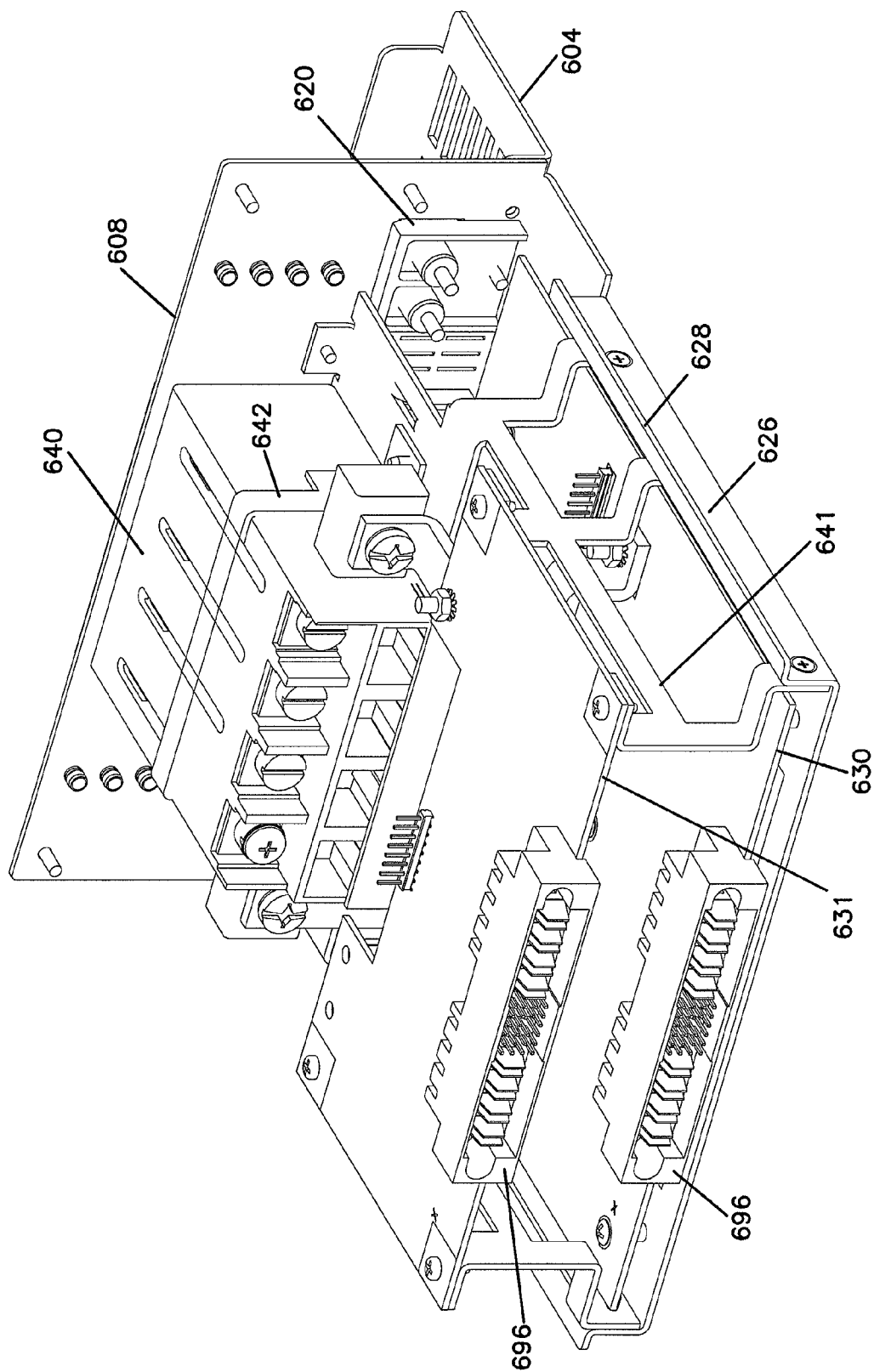
FIG. 32 is a rear perspective view of the first circuit module of FIG. 31.
Figure 33:
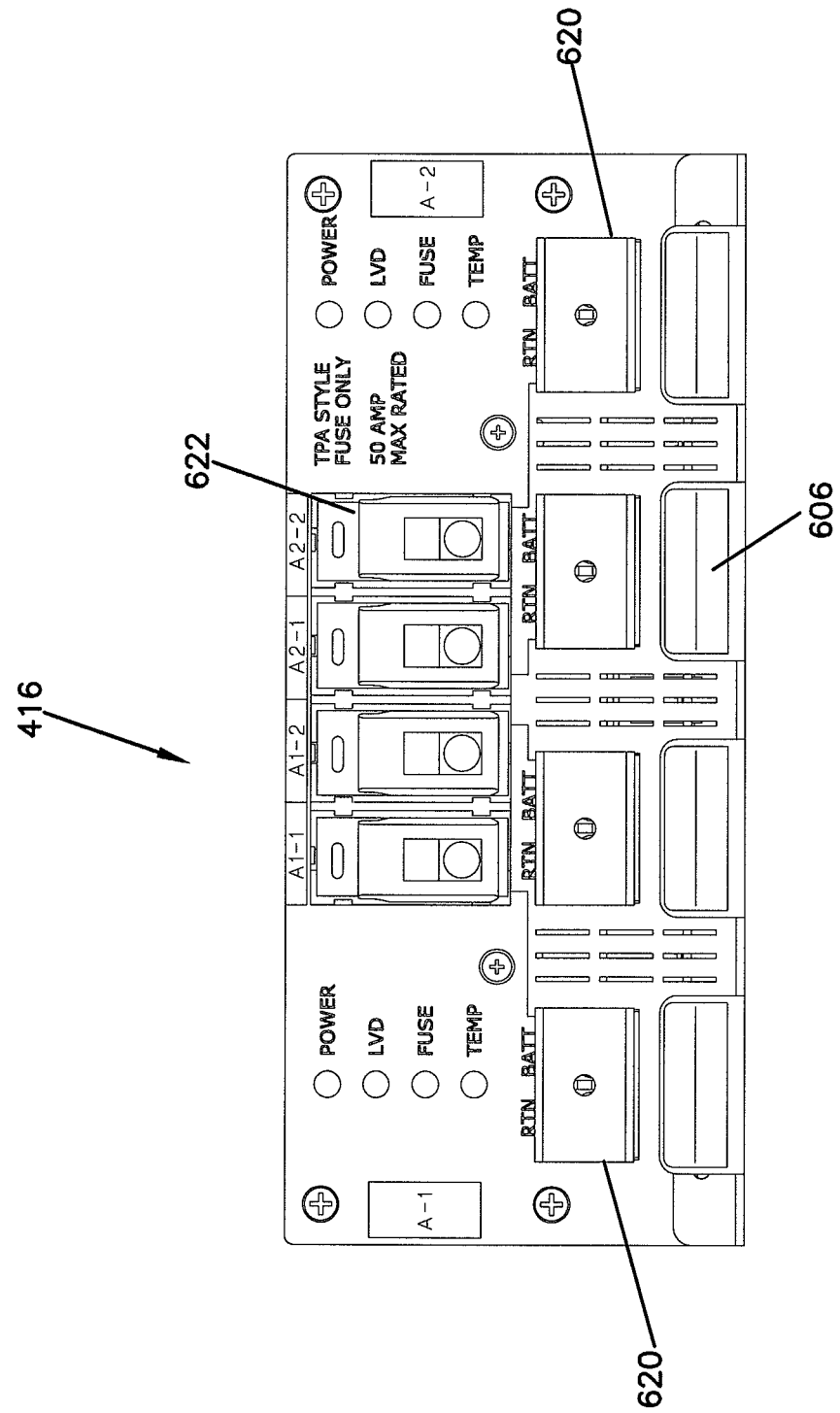
FIG. 33 is a front view of the first circuit module of FIG. 31.
Figure 37:
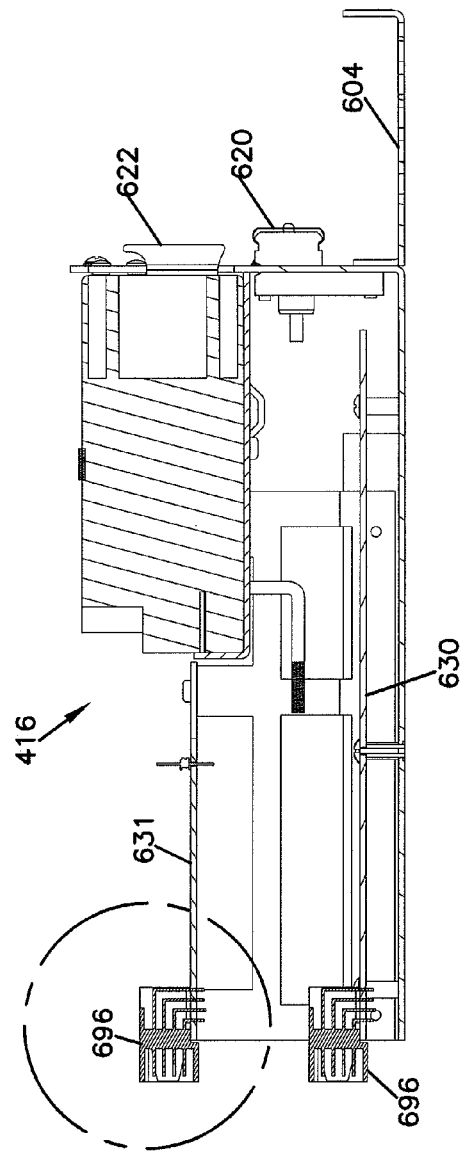
FIG. 37 is a cross-sectional view of the first circuit module of FIG. 31, taken along lines 37-37 of FIG. 35.
Figure 34:
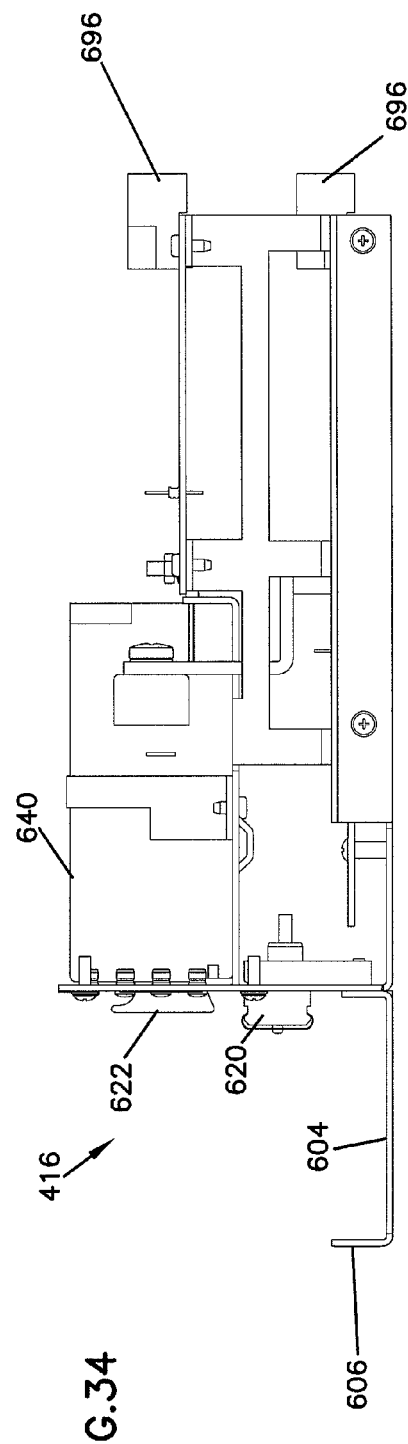
FIG. 34 is a side view of the first circuit module of FIG. 31.
Figure 35:
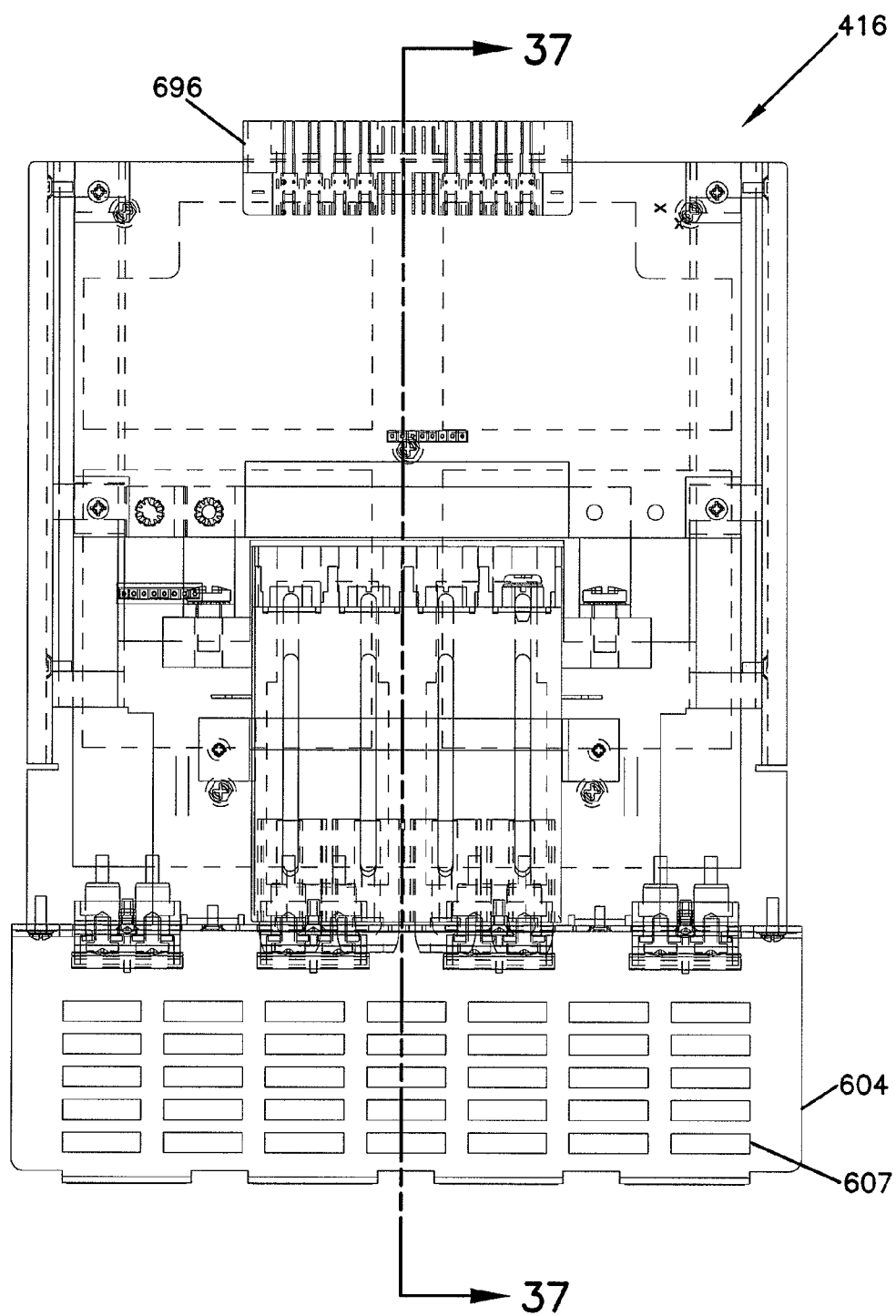
FIG. 35 is a top view of the first circuit module of FIG. 31.
Figure 36:
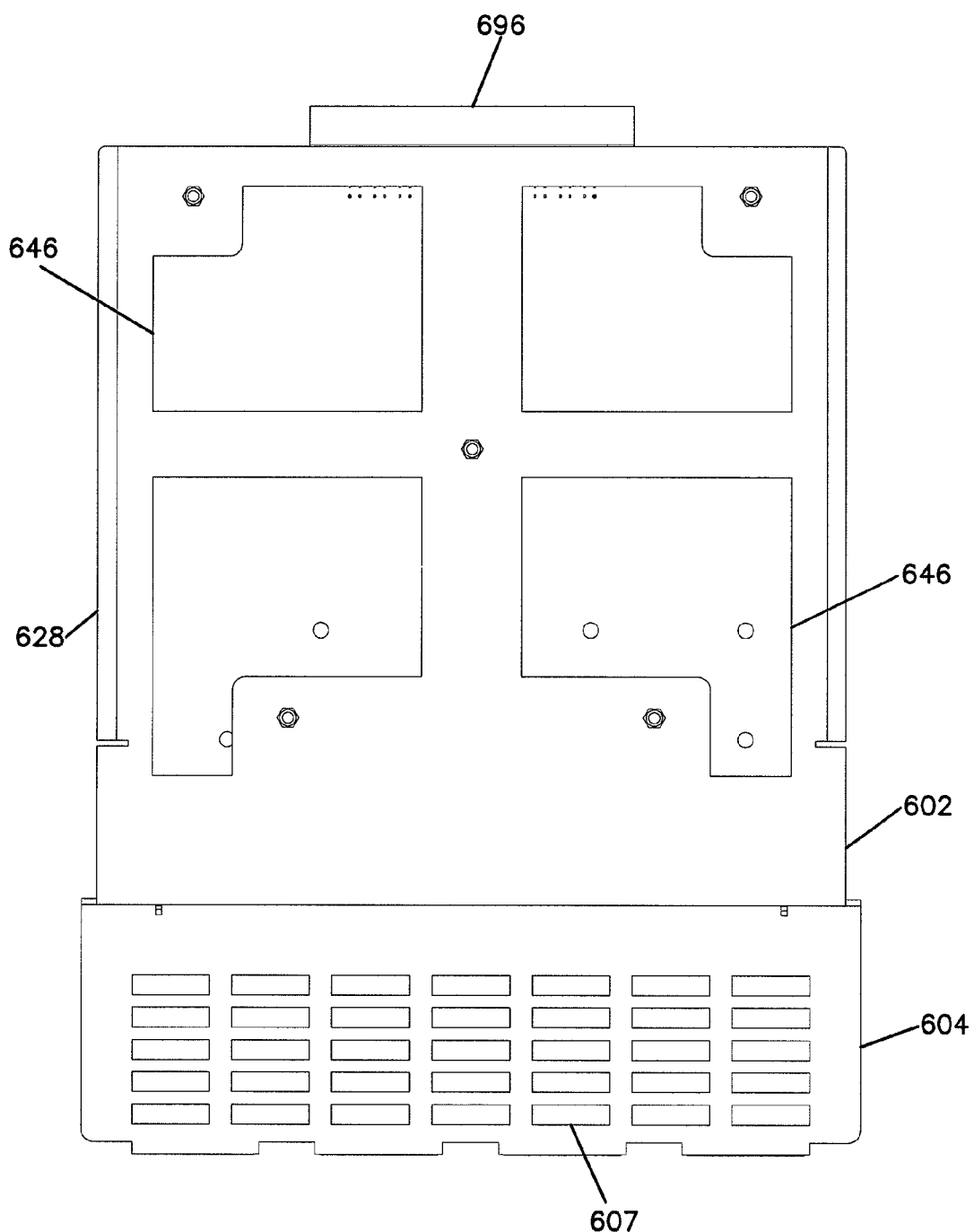
FIG. 36 is a bottom view of the first circuit module of FIG. 31.

Referring now to FIGS. 29 and 30, a further embodiment of a panel 510 is shown. Panel 510 includes the same chassis 430 as for panel 410, and four second modules 418, two on each side. Panel 510 also is shown including baffle plate 480. Baffle plate 480 also includes a front lip 482 positioned in an upward direction relative to a remainder of baffle plate 480. Front lip 482 and the rest of baffle plate 480 can also function as a cable tray for holding cables extending to and from panel 510, or for cables extending between equipment on either side of panel 510.

Referring now to FIGS. 31-39, first module 416 is shown in greater detail. Module 416 includes a frame 600 including a base 602, and a front tray 604 with front lips 606. Front tray 604 includes perforations 607 for use with cable ties. A vertical support 608 extends up from base 602 and defines a plurality of openings 610, 612 for output terminal units 620, and fuses 622, respectively. Base 602 also includes sides 626 and longitudinal rails 628. Two printed circuit boards 630, 631 connect between module connectors 696 and the circuit elements including output terminal units 620 and fuses 622. Fuse holder or block 640 with fuses 622 is held in place by a support tray 641 and a strap 642. Various openings 646 are provided in base 602 and tray 641 to assist with ventilation.

Referring now to FIGS. 40-48, second module 418 includes a frame 700 including a base 702, and a front tray 704 with front lips 706. Similar perforations 707 are provided for use as cable ties in front tray 704. A vertical support 708 defines a plurality of openings 710, 712 for output terminal units 720 and fuses 722 respectively. Frame 700 includes sides 726, and longitudinal rails 728. A printed circuit board 730 connects between module connector 696 and the circuit elements including output terminal units 720 and fuses 722. Various openings 746 are provided in base 702 to assist with ventilation.

Figure 38:
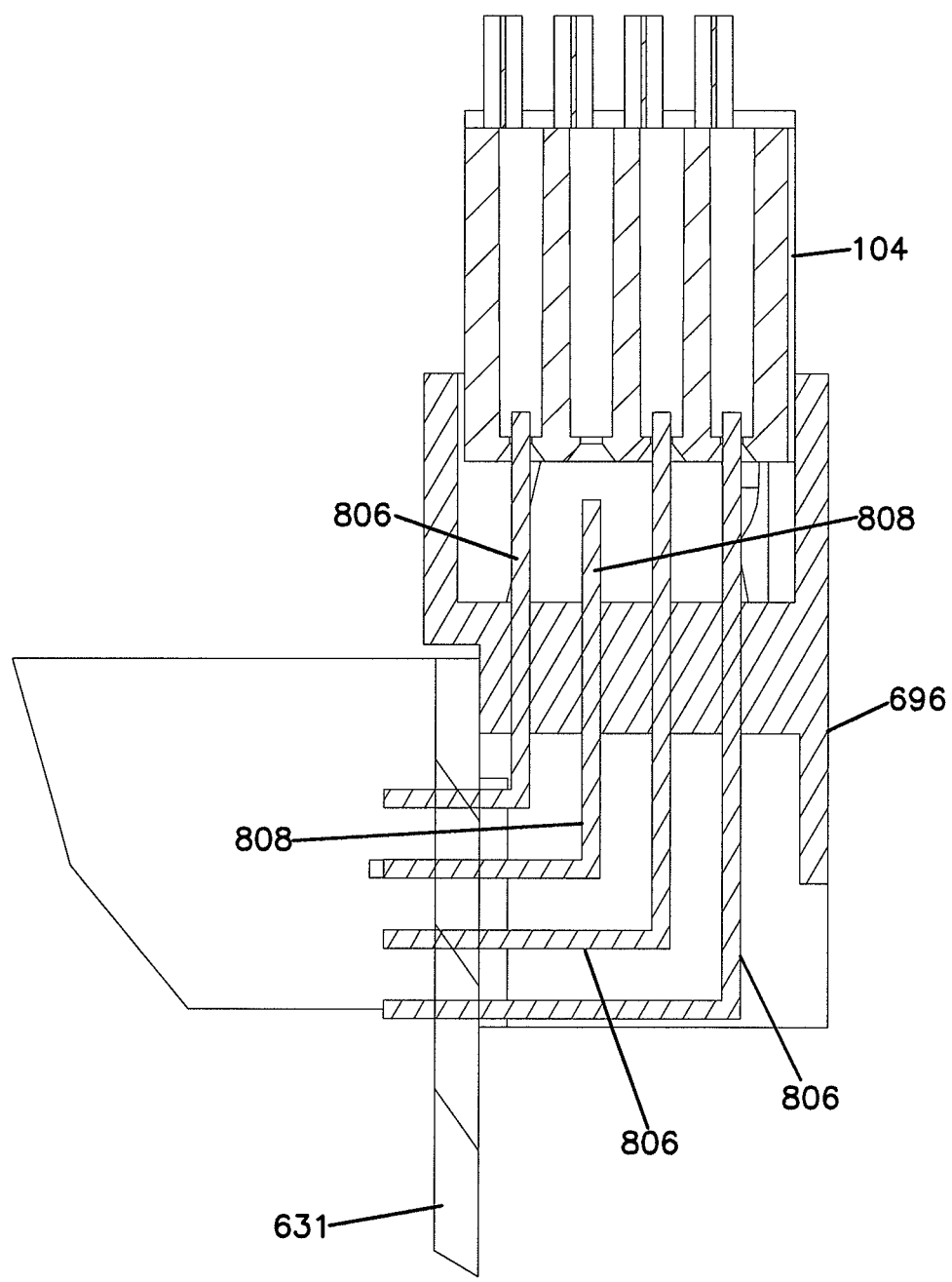
FIG. 38 is an enlarged view of a portion of the first circuit module of FIG. 37, shown partially connected to a backplane connector.
Figure 39:
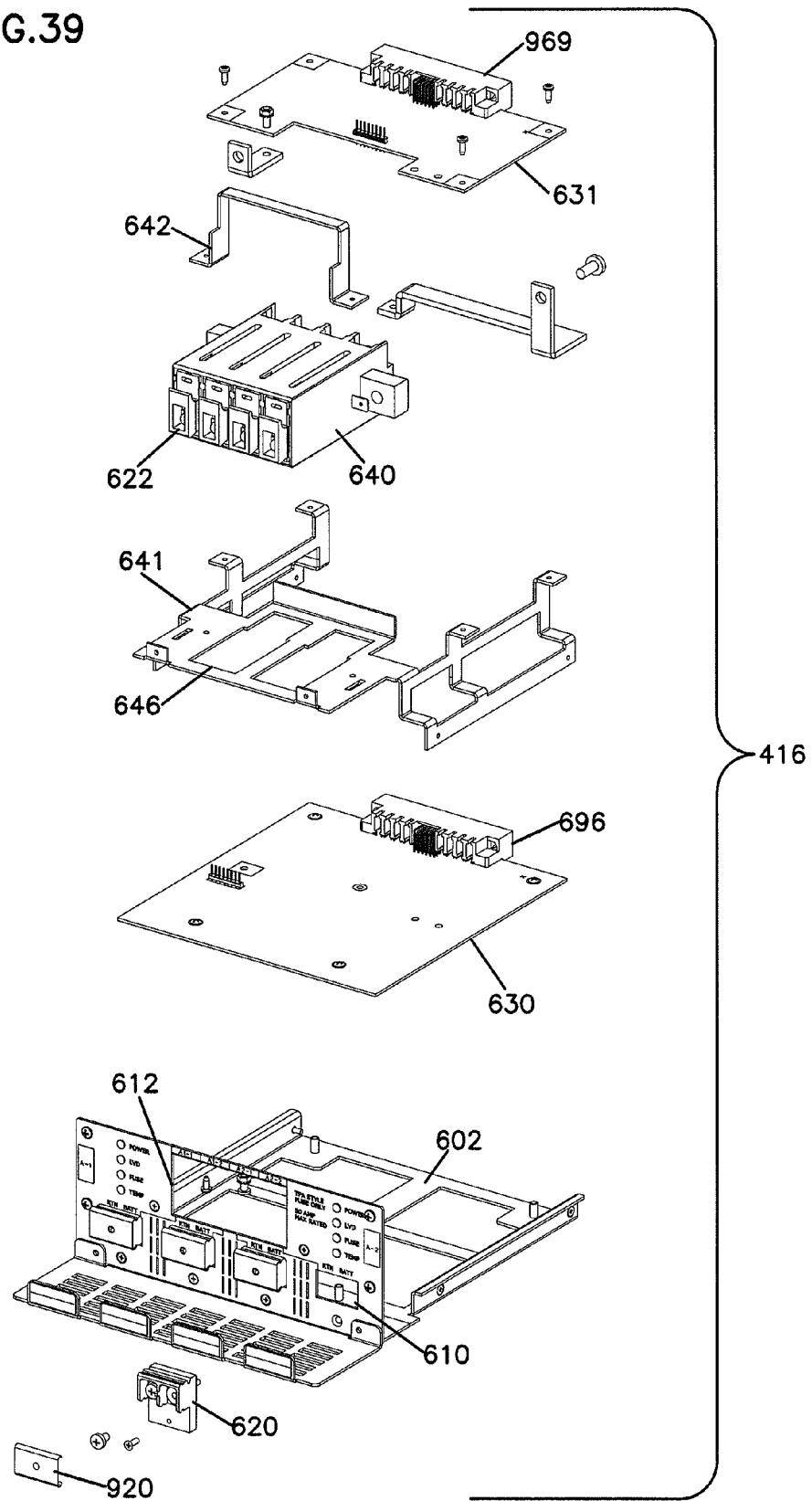
FIG. 39 is an exploded front perspective view of the first circuit module of FIG. 31.
Figure 40:
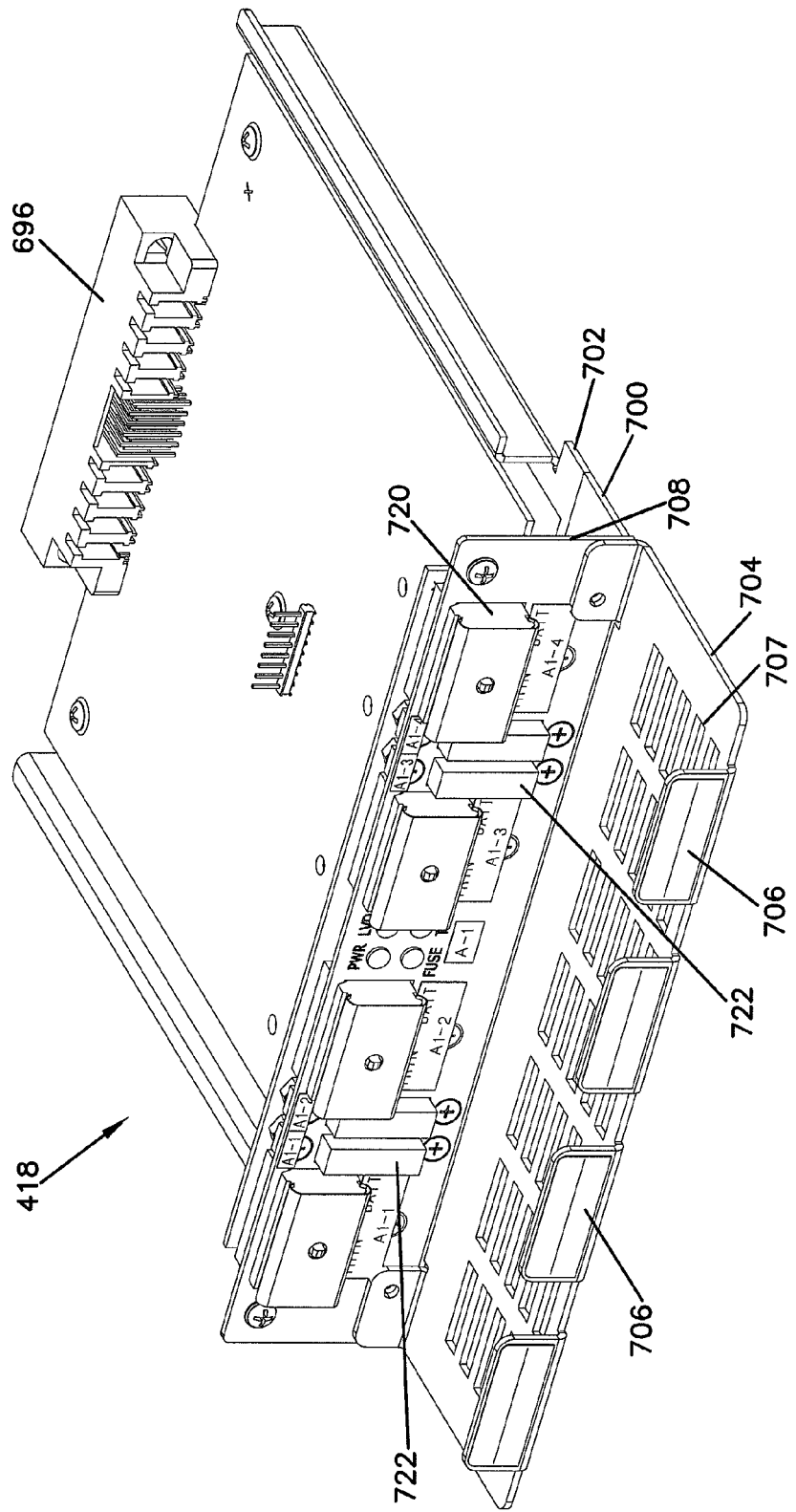
FIG. 40 is a front perspective view of a second circuit module of the power distribution panel of FIG. 21.
Figure 41:
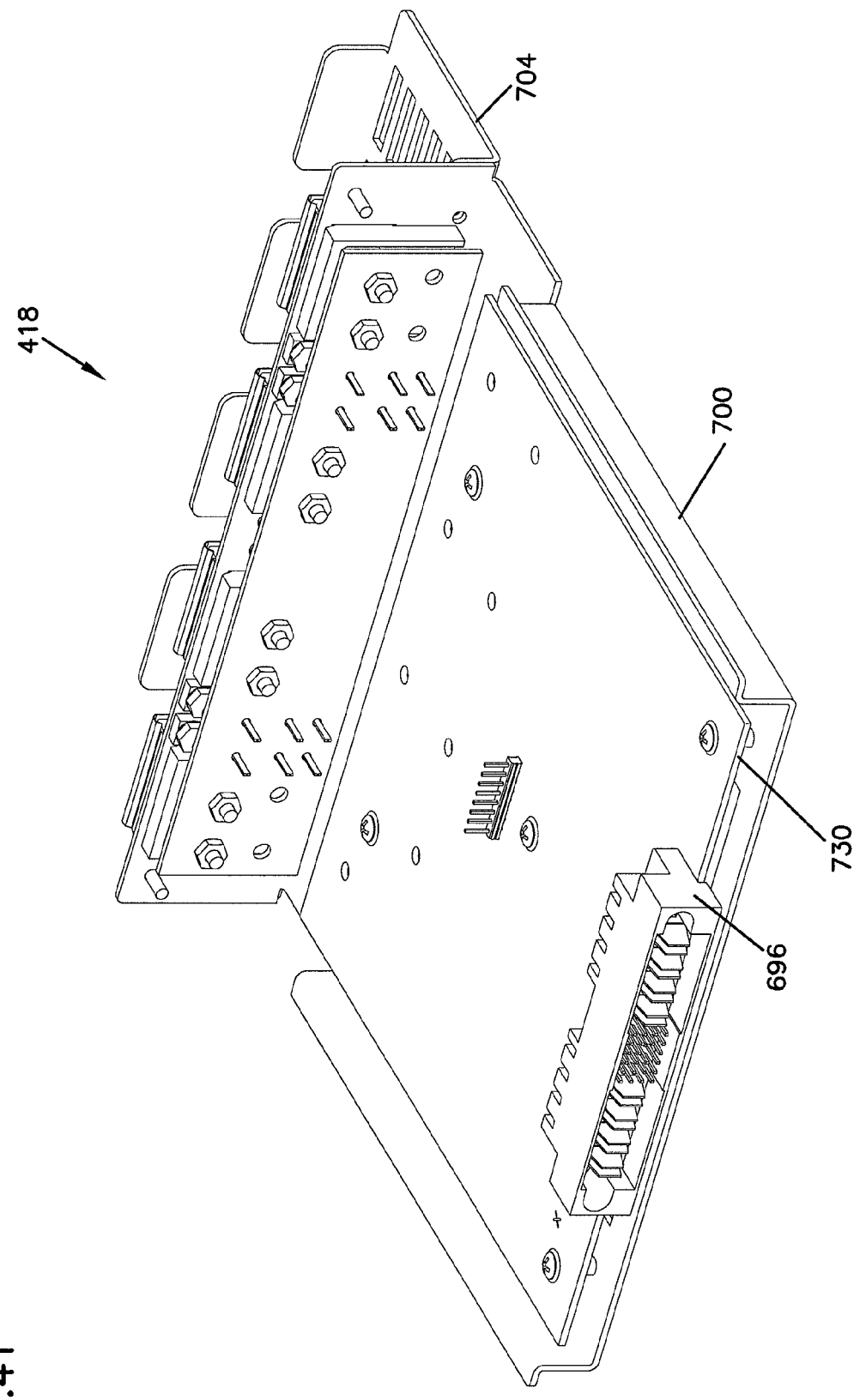
FIG. 41 is a rear perspective view of the second circuit module of FIG. 40.
Figure 42:
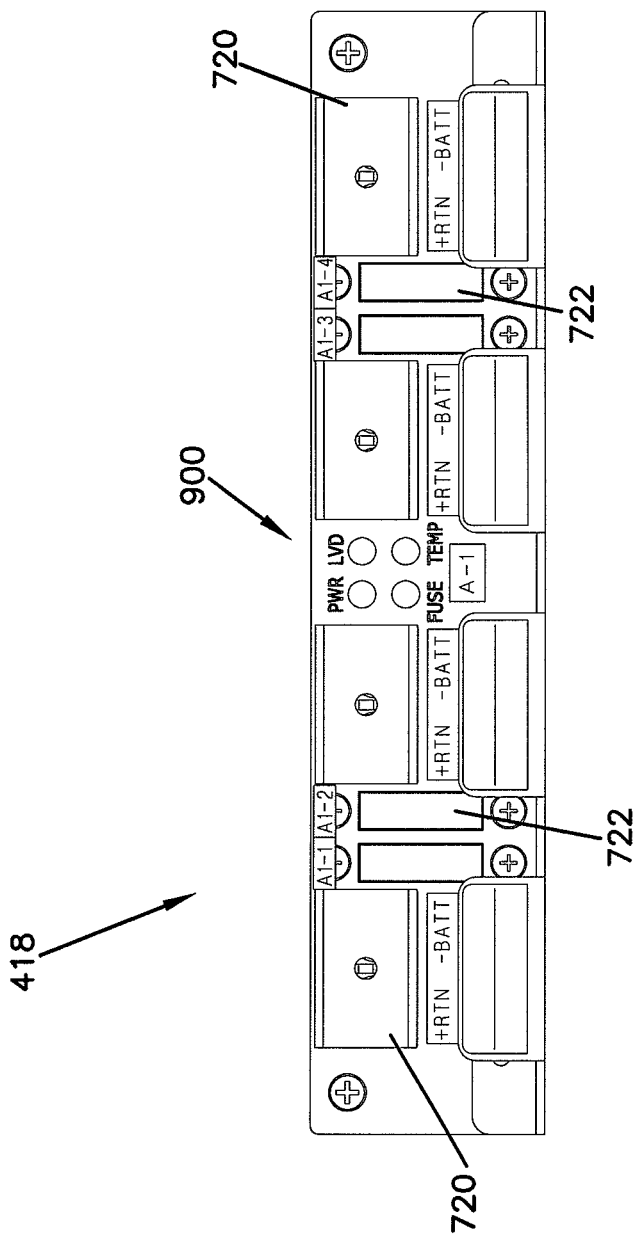
FIG. 42 is a front view of the second circuit module of FIG. 40.
Figure 46:
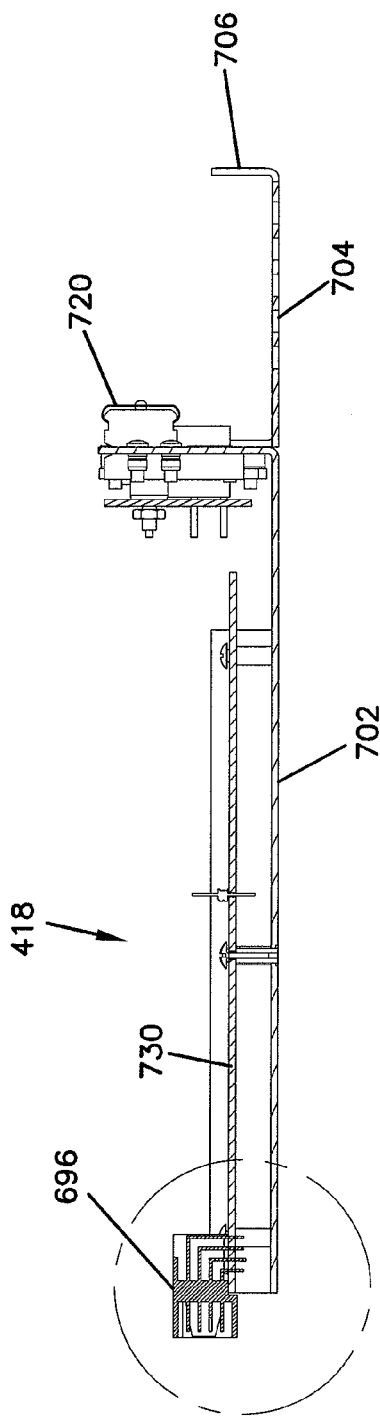
FIG. 46 is a cross-sectional side view of the second circuit module of FIG. 40, taken along lines 46-46 of FIG. 44.
Figure 43:
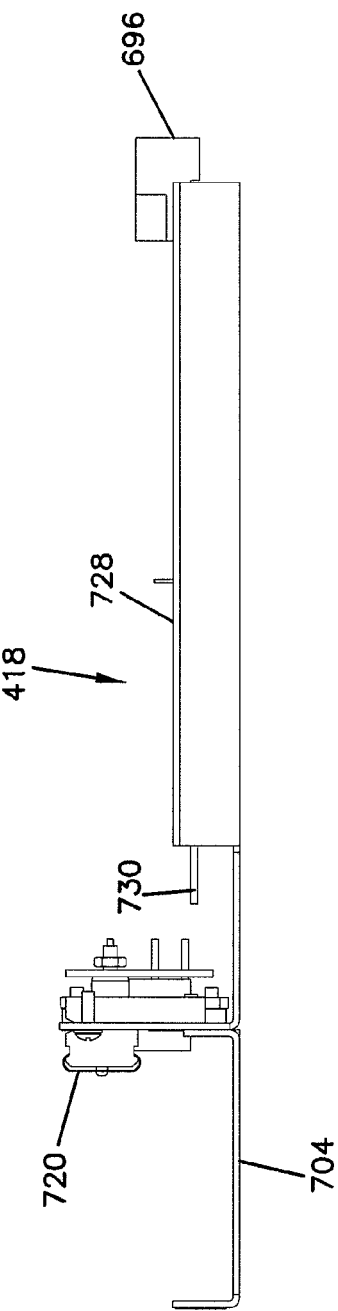
FIG. 43 is a side view of the second circuit module of FIG. 40.
Figure 44:
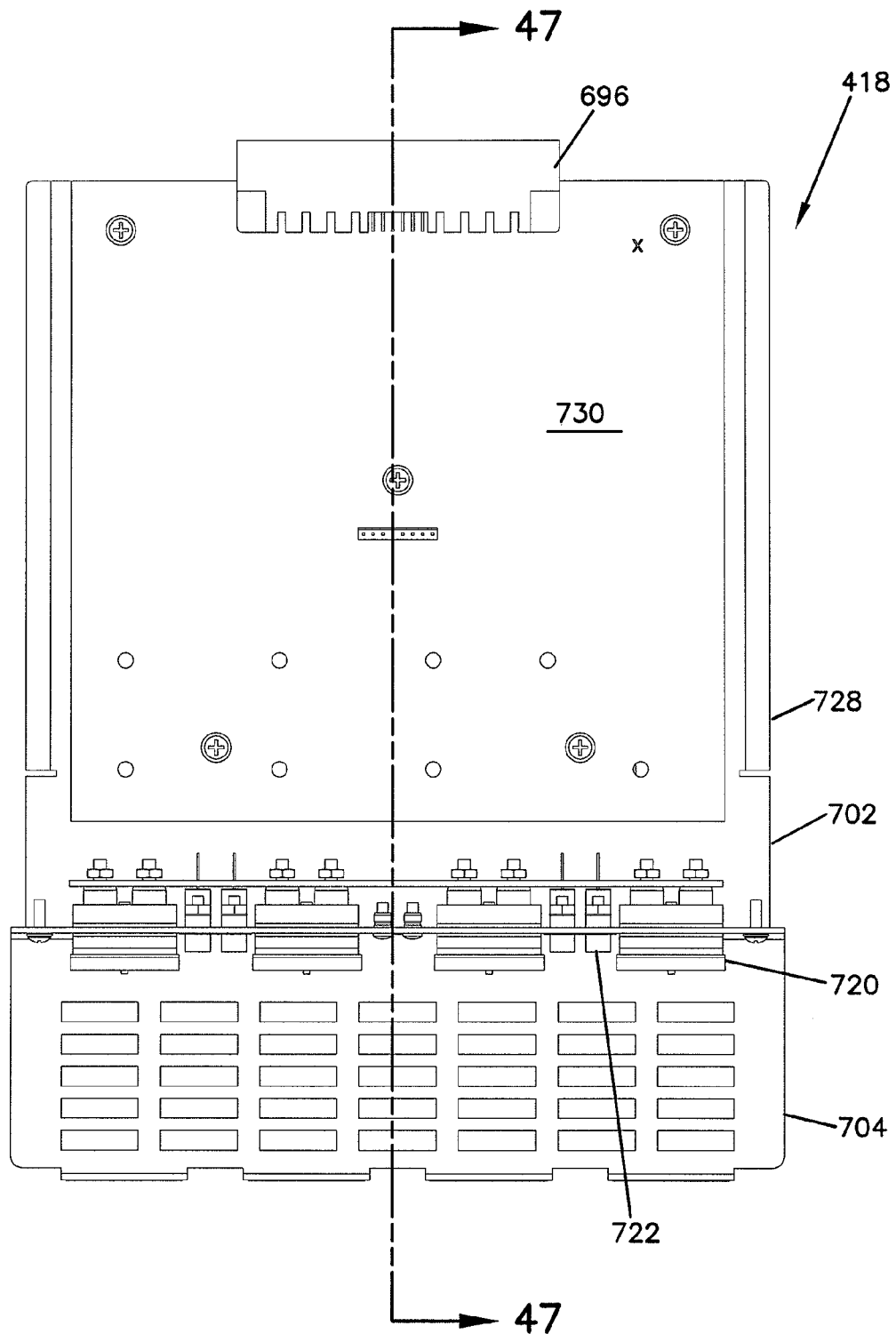
FIG. 44 is a top view of the second circuit module of FIG. 40.
Figure 45:
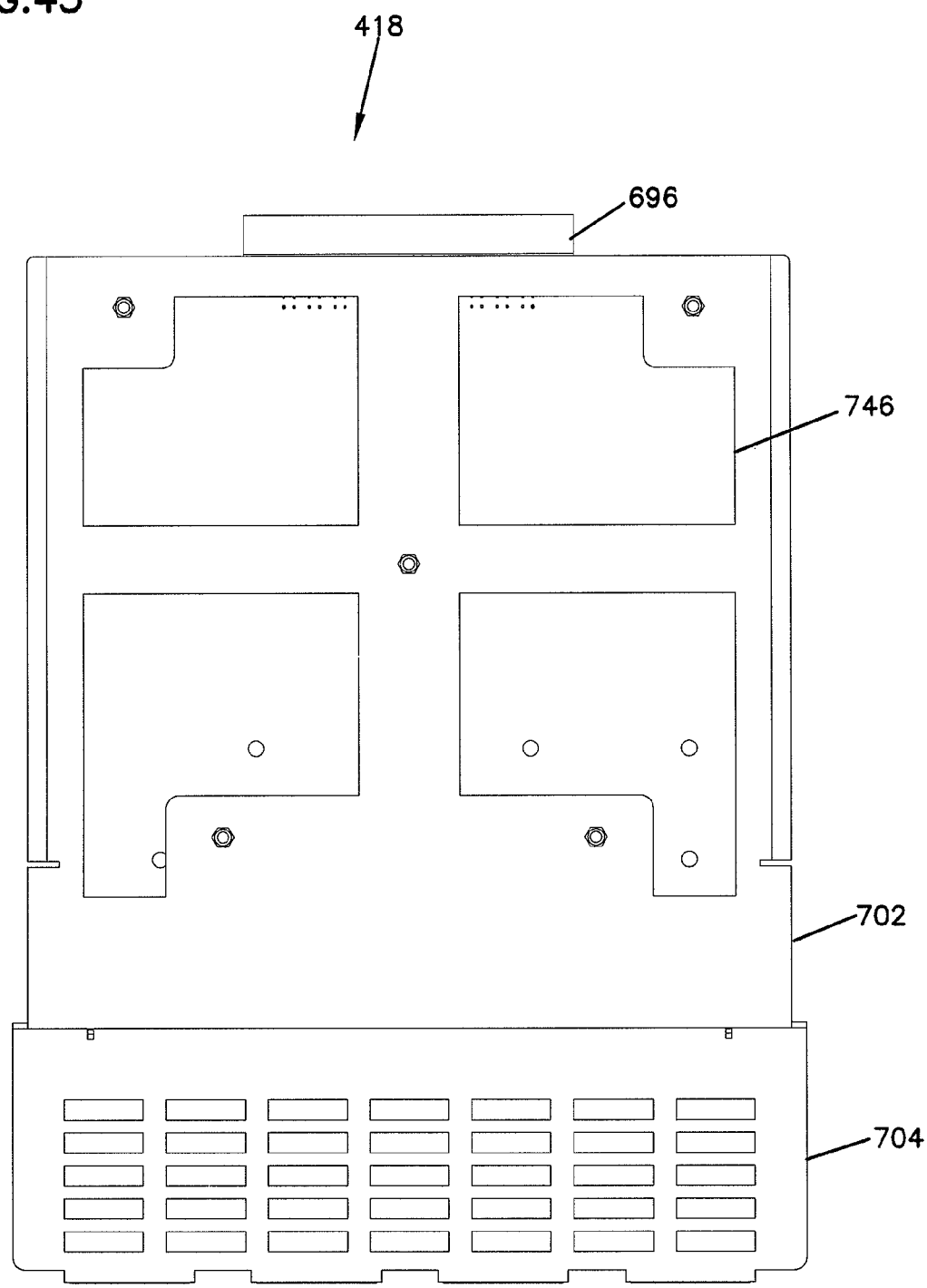
FIG. 45 is a bottom view of the second circuit module of FIG. 40.
Figure 47:
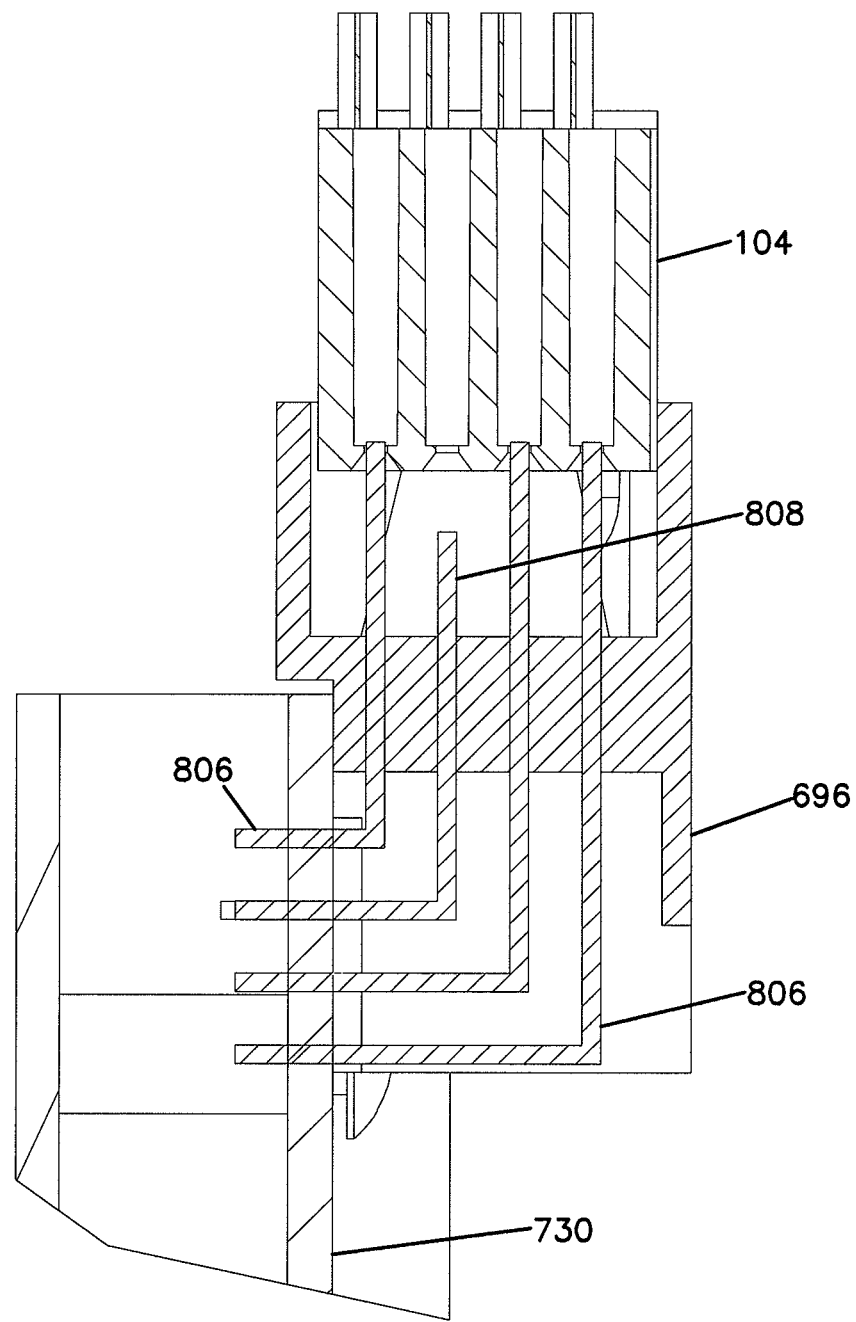
FIG. 47 is an enlarged view of a portion of the second circuit module of FIG. 46, shown partially connected to a backplane connector.
Figure 48:
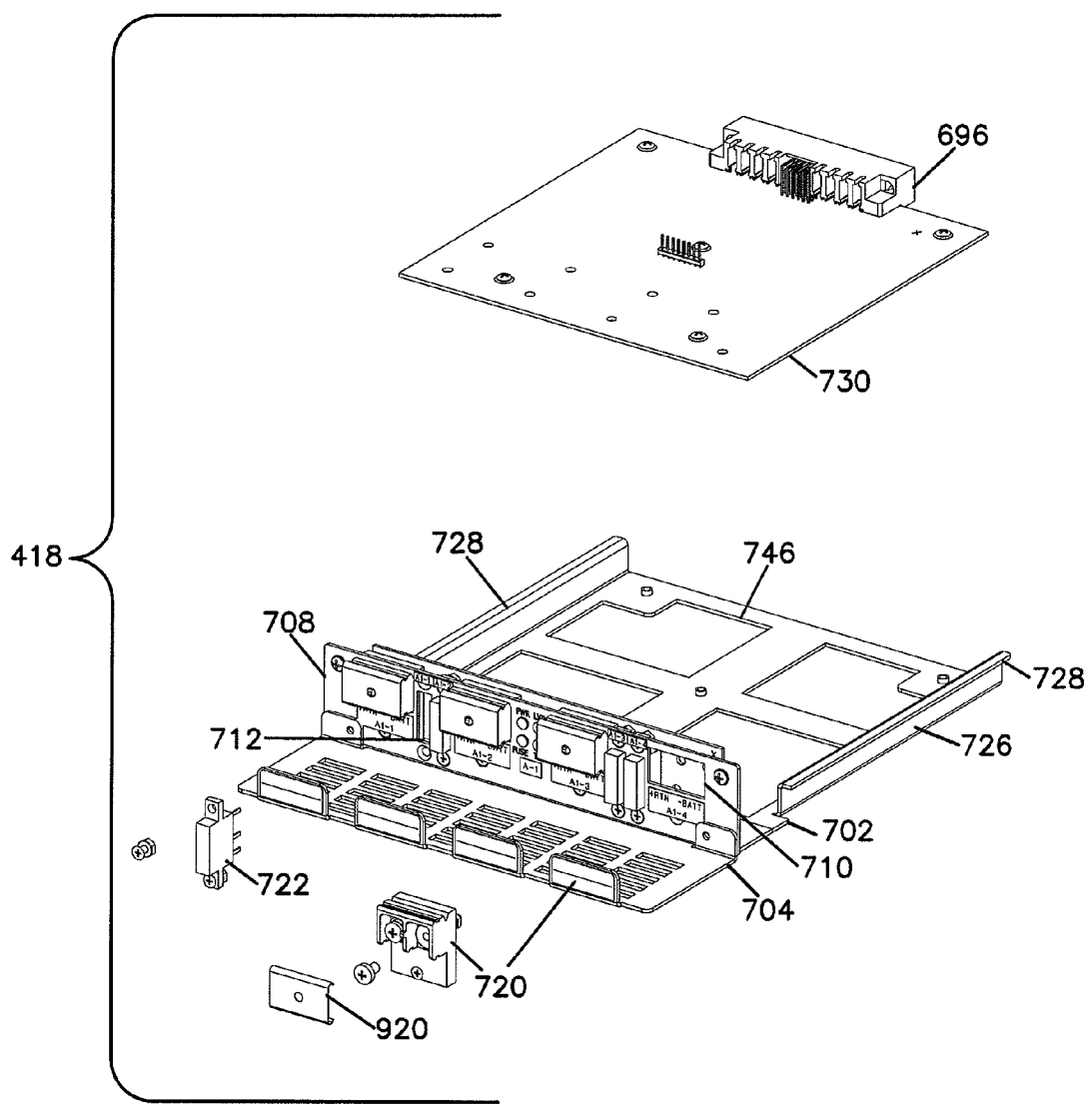
FIG. 48 is an exploded perspective view of the second circuit module of FIG. 40.
Figure 49:
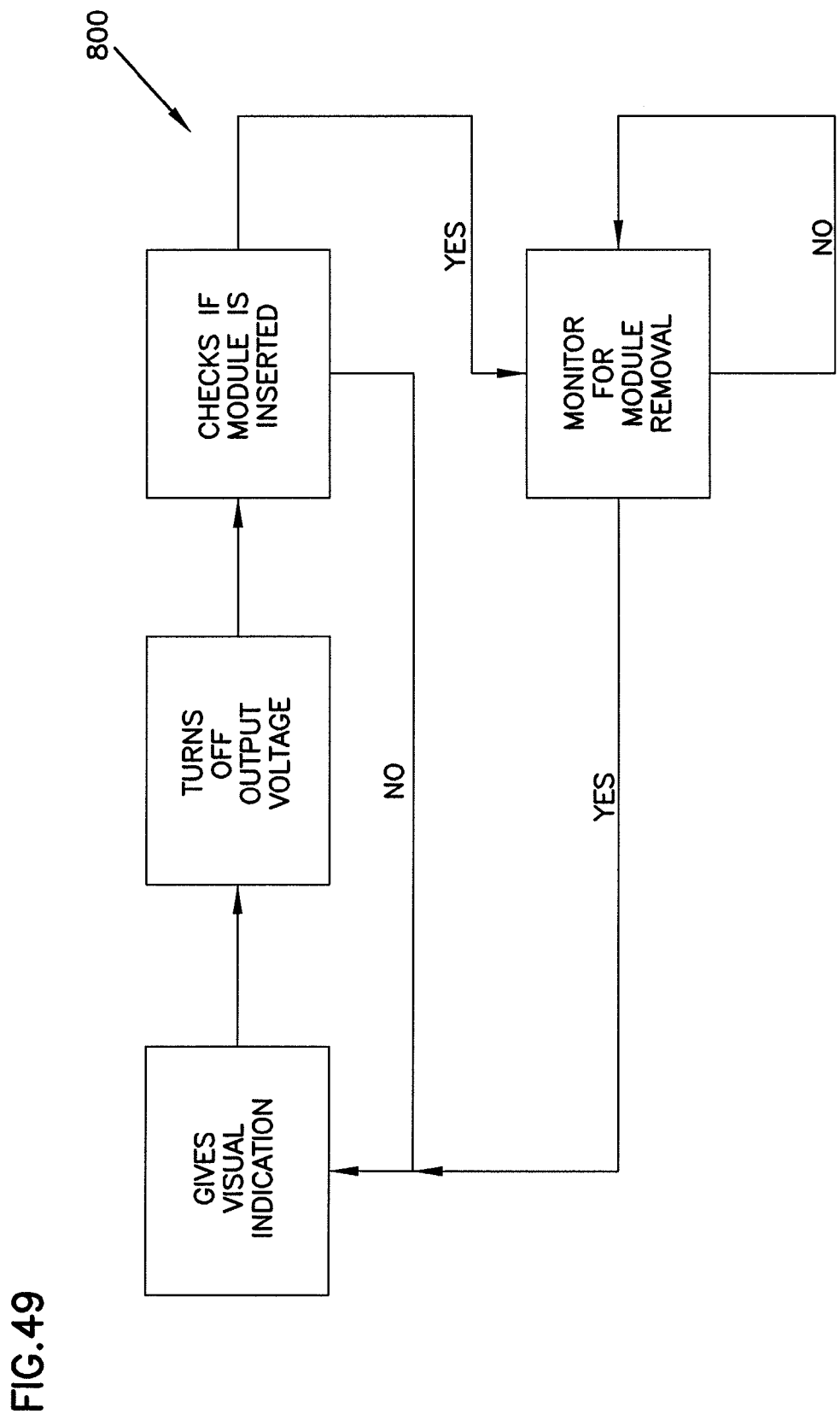
FIG. 49 is a flow chart relating to the voltage disconnect monitor.

Referring now to FIGS. 38, 47, and 49, a voltage disconnect feature is illustrated. One issue that can arise with removing of a module during operation is that arcing may occur between the connectors 696 of the modules, and the connectors 104 of the backplane. A voltage disconnect system 800 is provided to turn off the power to the module prior to removal of the module in order to prevent arcing. A selected pin 808 among pins 806 of connector 696 is provided with a shortened length. The shortened pin 808 will disengage first before the power connections disengage. This will provide an interrupt signal that will be received by a device, such as a microcontroller or a similar device on the module, to activate a voltage disconnect mechanism which turns off the current to the load. This will prevent arcing on the connectors and prevent damage from occurring. Furthermore, if the module is not completely inserted, the short pin 808 will prevent the voltage disconnect mechanism from activating and keep the output current turned off until the module is fully inserted. A visual indication will be displayed if the module is not fully inserted. FIG. 49 illustrates an example flow chart illustrating the voltage disconnect feature.

Each module 416, 418 includes various visual indicators to indicate system conditions. For example, there are provided visual indications for power, low voltage, blown fuse, and excess temperature through visual indicators 900.

Power input covers 910, and power output covers 920 can be provided if desired.

Figure 50:
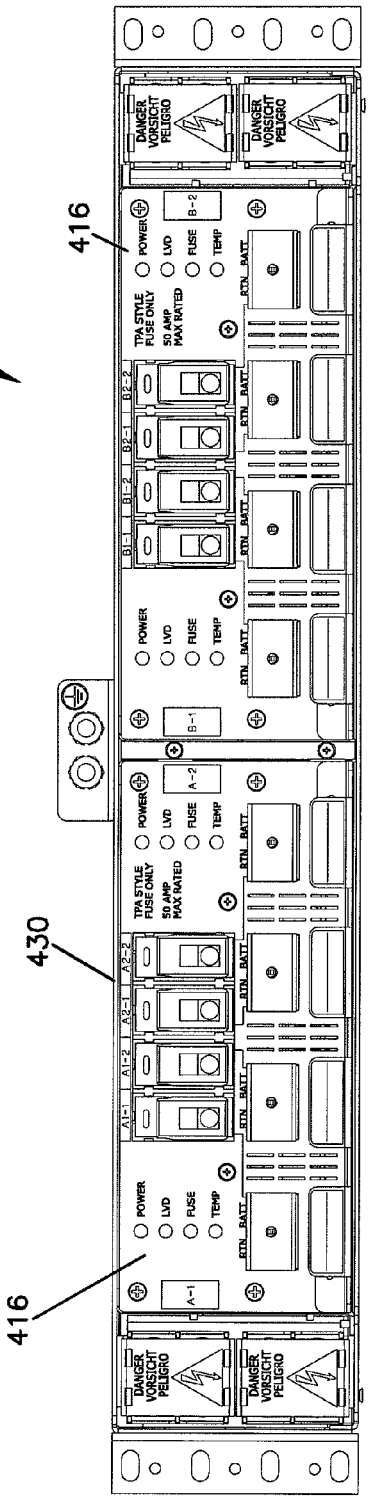
FIG. 50 shows greater detail of a front of a power distribution panel including two of the first circuit modules of FIG. 31, including the label configurations.
Figure 51:
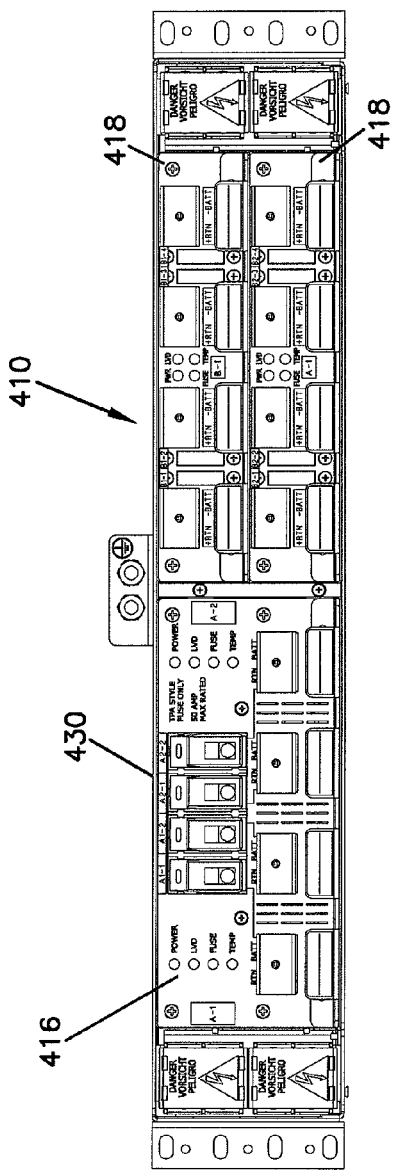
FIG. 51 shows greater detail of a front of the power distribution panel of FIG. 21, including the label configurations.
Figure 52:
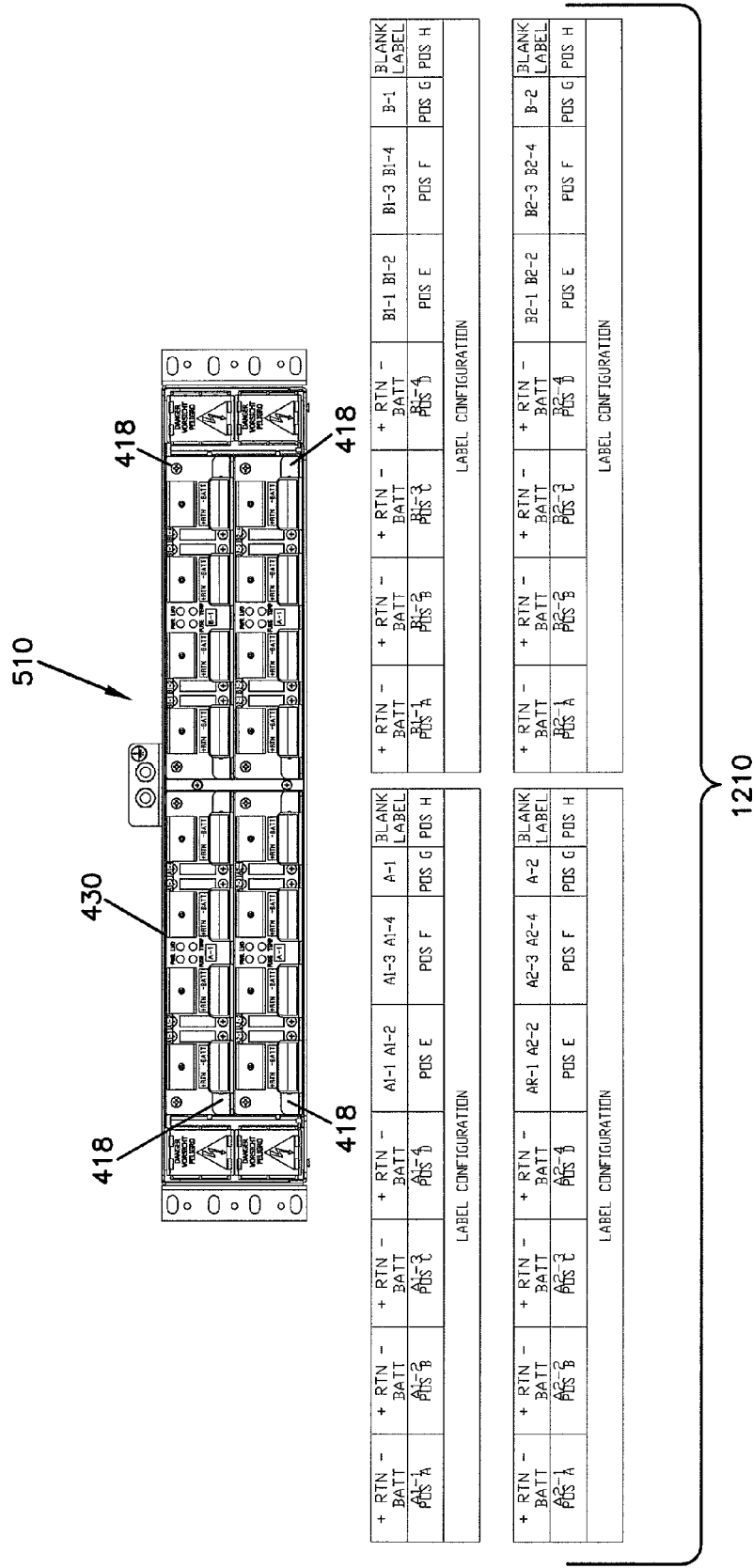
FIG. 52 shows in greater detail a front of another power distribution panel including four of the second circuit modules of FIG. 40, including the labeling configurations.

As shown in FIGS. 50-52, various arrangements for panels 410, 510, 1010 are shown using the same chassis 430. Labels 1200, 1210, 1220 can be used to label each module 416, 418 as needed for each arrangement. Labels 1200, 1210, 1220 can be adhesively attached to each module 416, 418 as needed.

Although FIGS. 1-52 describe certain configurations for a power distribution panel, it is understood that additional types of power distribution panels can be used as well. For example, other types of panels can be used, such as those described in U.S. patent application Ser. No. 11/654,367, filed Jan. 17, 2007, the disclosure of which is hereby incorporated by reference in its entirety.

Figure 53:
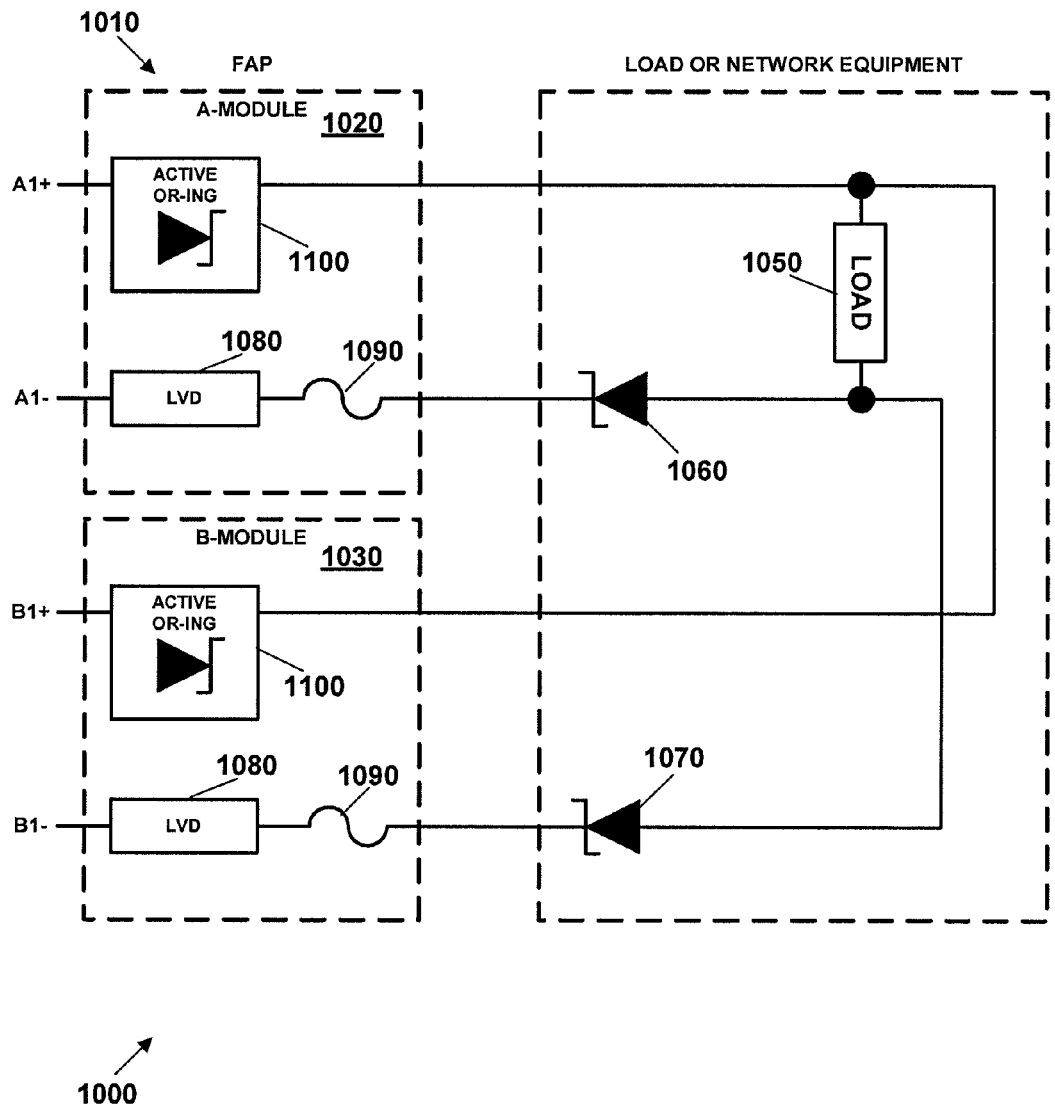
FIG. 53 shows a schematic view of a power distribution circuit used in the power distribution panels of the present disclosure.
Figure 54:
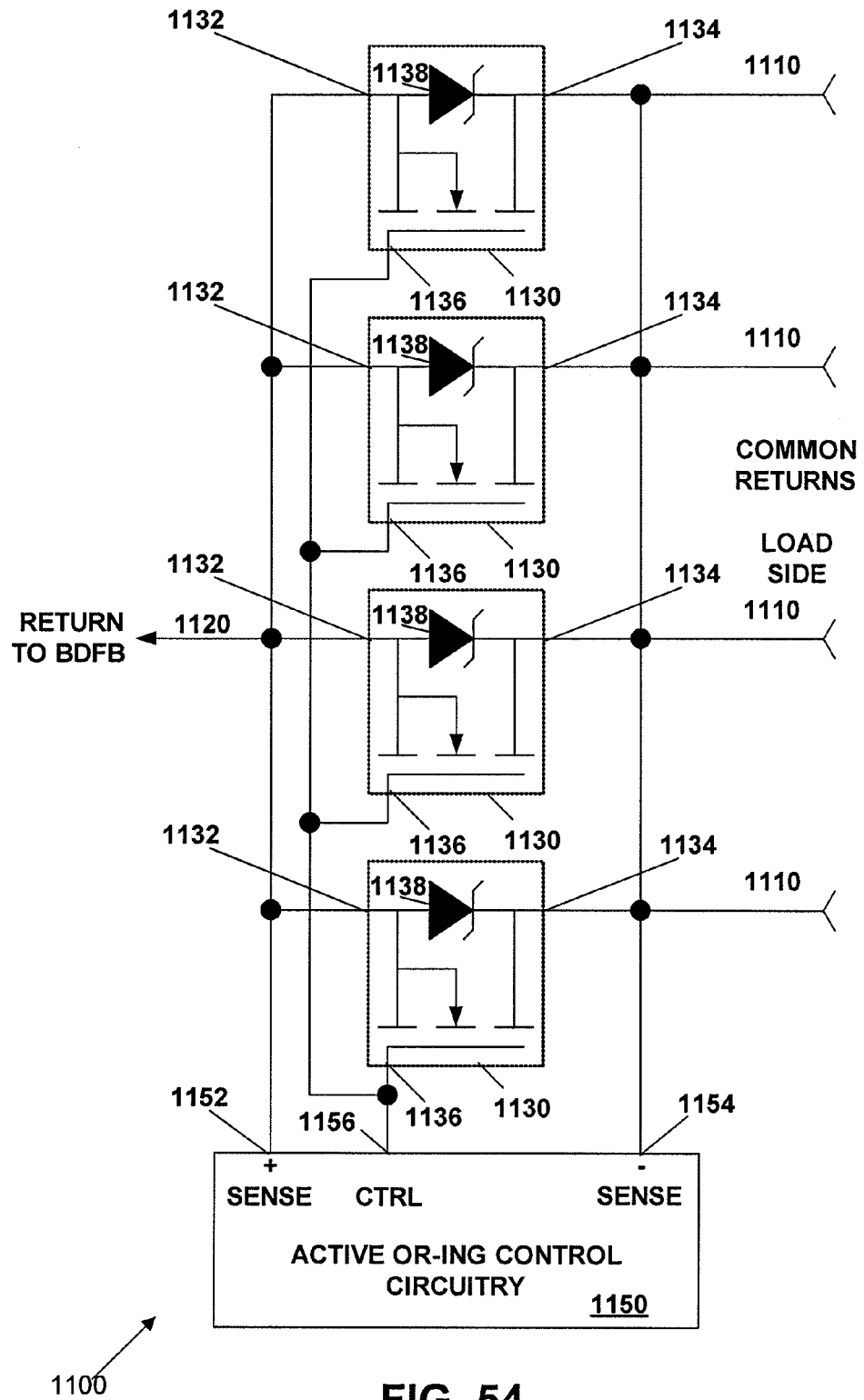
FIG. 54 shows a schematic view of a protection circuit used in the power distribution panels of the present disclosure.

Now referring to FIGS. 53-54, load protection circuits are shown that can be implemented in the power distribution units and panels of the present disclosure. FIG. 53 illustrates a power distribution circuit 1000 in which a power distribution unit can be used, according to a possible embodiment of the present disclosure. The power distribution circuit 1000 includes a power distribution unit 1010 including at least two power channels 1020, 1030. Each of the power channels 1020, 1030 are shown to be connected to load equipment 1040, which includes a load device 1050 and protection diodes 1060, 1070.

Each of the power channels 1010, 1020 includes a negatively polarized supply path and a positively polarized return path. In the embodiment shown, power channel 1010 includes a supply path A1− and return path A1+, and power channel 1020 includes supply path B1− and return path B1+. For each of the power channels, the supply path (e.g. A1−, B1−) connects to a low voltage disconnect circuit 1080 and a fuse 1090, which protect the load equipment 1040 from unexpected power distribution events. In the embodiment shown, the low voltage disconnect circuit 1080 disconnects the channel from supplying a voltage lower than the rated or expected voltage to be supplied to the load equipment 1040. The fuse 1090 prevents overcurrent events from reaching the load equipment. Other circuit protection equipment can be included at the supply path of each channel as well.

At the return path A1+, B1+ of each power channel 1020, 1030, a switching circuit 1100 selectively allows current to pass in a single direction, such that current flow from a battery (not shown) connected to each channel in a reversed direction (i.e. with a positive terminal connected to the supply path A1− or B1− and a negative terminal connected to the return path A1+ or B1+) is blocked. The switching circuit 1100 also prevents return path current existing on a return path when the corresponding supply path (and overall channel) is inactive. For example, the switching circuit 1100 prevents current on path B1+ when channel 1030 is inactive but channel 1020 is active, and prevents current on path A1+ when channel 1020 is inactive but channel 1030 is active.

FIG. 54 illustrates details of the switching circuit 1100. The switching circuit 1100 acts as a circuit protection system for a power distribution panel, and, in certain embodiments, represents an "active-OR" circuit arrangement. The switching circuit 1100 connects to a plurality of return connections 1110 from a load (e.g. load equipment 1040 of FIG. 53), which are consolidated as a return path 1120 (e.g. path A1+ or B1+ of FIG. 53) of the power distribution circuit. The return path 1120 is connected to a return, or positive, terminal of a battery or other power supply. The switching circuit 1100 includes one or more transistors, shown as MOSFET devices 1130, which are arranged in series. Each device 1130 has a source 1132, drain 1134, gate 1136, and a body diode 1138. The devices 1130 are connected in parallel, with all sources 1132 interconnected to the return path 1120, all drains 1134 interconnected to the return connections 1110, and all gates 1136 interconnected. In the embodiment shown, the MOSFET devices 1130 are N-Channel enhanced MOSFET devices; however, P-Channel MOSFET devices or other types of high-current, low voltage-drop devices are useable as well.

A control circuit 1150 selectively activates the MOSFET devices based on sensed voltages at the return connections 1110 and return path 1120. The control circuit includes two sensing pins 1152, 1154 (shown as SENSE+ and SENSE−, respectively), and a control pin 1156. Sensing pin 1152 detects the voltage at the return path 1120, and pin 1154 detects voltage at the return connections 1110. The control pin 1156 connects to the interconnected gates 1136, and acts to selectively activate the MOSFET devices 1130 based on the voltages sensed at the sensing pins 1152, 1154.

In operation, the circuitry of FIGS. 53-54 is arranged for high current applications. For example, depending upon selection of specific components for use in the switching circuit 1100, the circuitry can support approximately 75-125 amps of current passing through each channel of the power distribution panel.

In operation, when the channel associated with the switching circuit 1100 is inactive, the body diodes 1138 in the MOSFET devices 1130 operate similarly to a Schottky diode to prevent current flow if the voltage difference between the return connections 1110 and the return path 1120 is below a forward voltage determined by the characteristics of the Schottky diode. The forward voltage of the body diodes 1138 is preferably selected to be higher than is generally used in similar power applications (typical Schottky diodes used in similar applications have a forward voltage of approximately 0.35 V). In certain embodiments, the body diode 1138 has a forward voltage of about 0.45 V to about 2 V. In certain applications, the forward voltage of the body diode is about 0.9 V to about 1.2 V. The higher voltage for the body diode 1138, in conjunction with the presence of four paralleled MOSFET devices 1130, helps to prevent current from flowing in the return path when the module is powered down. This is at least in part due to the fact that substantial additional energy is required to forward bias the multiple body diodes of greater voltage, as compared to a single, lower voltage body diode.

The higher voltage drop corresponds to a large amount of heat dissipation when the devices 1130 are used in a high current application, such as a power panel. Due to this high current passing through the devices 1130, the MOSFET devices are activated during operation, to reduce the voltage drop across the devices to a few millivolts, thereby significantly reducing the heat dissipation at each MOSFET device. Incorporating additional MOSFET devices 1130 allows further separation of heat dissipating elements during circuit operation.

When a negative voltage condition such as either a reverse battery condition (e.g. the voltage across sensing pins 1152, 1154 is reversed) or a voltage difference is detected across two battery sources (e.g. where the voltage source associated with the channel having switching circuit 1100 has a lower voltage than another channel connected to the load) is sensed, the control circuit 1150 deactivates the MOSFET devices 1130, causing the body diodes 1138 to block the reverse battery current from flowing to the load device connected to the channel associated with the circuit 1100 (e.g. as seen in FIG. 53).

Although the switching circuit 1100 is shown using four MOSFET devices 1130, more or fewer devices can be included in the circuit. Additional devices could provide more redundancy/failsafe characteristics, and can act to divide down the current load passing through each device. The additional devices can also provide improved thermal characteristics, possibly allowing for exclusion of a heatsink from the MOSFET devices. Furthermore, it is preferable that each of the MOSFET devices 1130 is individually rated to have sufficient current capacity to pass all of the possible current from the return connections 1110 to the return path 1120.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A circuit protection system for a power panel, the system comprising:
   a transistor connected in a channel of a power panel, the transistor connected between return connections of a load and a return path, the power panel including a plurality of channels connected to the load; and
   control circuitry electrically connected in parallel with the transistor, the control circuitry configured to selectively activate the transistor to allow current to pass through the transistor based on an observed voltage across the transistor when the channel is active but block current through the transistor when the channel is inactive.

2. The circuit protection system of claim 1, further comprising a plurality of transistors connected in parallel between the return connections and the return path.

3. The circuit protection system of claim 1, wherein the transistor is a MOSFET transistor.

4. The circuit protection system of claim 3, wherein the MOSFET transistor is an enhanced MOSFET transistor.

5. The circuit protection system of claim 1, wherein the transistor includes a body diode.

6. The circuit protection system of claim 5, wherein the body diode has a forward voltage of at least approximately 0.45 V.

7. The circuit protection system of claim 1, wherein the control circuitry includes a control signal connected to a gate of the transistor.

8. The circuit protection system of claim 7, wherein the control circuitry is configured to activate the gate during use of the channel by the load.

9. The circuit protection system of claim 7, wherein the control circuitry is configured to deactivate the gate upon detecting a reverse battery condition in the channel.

10. The circuit protection system of claim 7, wherein the control circuitry is configured to deactivate the gate upon detecting a negative voltage condition in the channel.

11. A power panel useable in a power distribution system, the power panel comprising:
    a plurality of channels, each channel including a supply path and a return path, the return path electrically connectable through the power panel to return connections of a load; and
    a circuit protection system associated with one of the plurality of channels, the circuit protection system including:
        a transistor connected between the return connections and the return path;
        control circuitry electrically connected in parallel with the transistor, the control circuitry configured to selectively activate the transistor to allow current to pass through the transistor based on an observed voltage across the transistor when the channel is active but block current through the transistor when the channel is inactive.

12. The power panel of claim 11, further comprising a plurality of circuit protection systems, each circuit protection system associated with a different one of the plurality of channels.

13. The power panel of claim 11, wherein each circuit protection system includes a plurality of transistors connected in parallel between the return connections and the return path.

14. The power panel of claim 11, wherein the control circuitry has a control signal connected to a gate of the transistor.

15. The power panel of claim 14, wherein the control circuitry is configured to activate the gate during use of the channel by the load.

16. The power panel of claim 14, wherein the control circuitry is configured to deactivate the gate upon detecting a reverse battery condition in the channel.

17. The power panel of claim 14, wherein the control circuitry is configured to deactivate the gate upon detecting a negative voltage condition in the channel.

18. A method of providing circuit protection in a power distribution panel, the method comprising:
    sensing a voltage above a threshold across a transistor connected between a return path and return connections of a module included in a power distribution panel configured to receive connections to a load;
    upon sensing the voltage above a threshold across the transistor when the channel is active, activating the transistor with control circuitry connected in parallel with the transistor; and
    otherwise deactivating the transistor, thereby blocking current through the transistor when the channel is inactive.

19. The method of claim 18, further comprising:
    sensing a voltage below a threshold across the transistor; and
    upon sensing the voltage below a threshold across the transistor, deactivating the transistor with the control circuitry.

20. The method of claim 18, further comprising:
    sensing a reverse battery condition with the control circuitry; and
    upon sensing the reverse battery condition, deactivating the transistor with the control circuitry.

21. A power panel comprising:
    a chassis including a top, a bottom, a front, a rear, and two sides;
    a plurality of power input connections on the chassis, each power input connection including a source input connection and a return input connection;
    a plurality of power output connections on the chassis, each of the power output connections including a source output connection and a return output connection, and each of the power output connections connected to a power input connection through the chassis; and
    a protection circuit connected between at least one of the power output connections and a power input connection, the protection circuit including:
        a transistor connected between the return output connection and the return input connection; and
        control circuitry electrically connected in parallel with the transistor, the control circuitry configured to selectively activate the transistor to allow current to pass through the transistor based on an observed voltage across the transistor when the channel is active but block current through the transistor when the channel is inactive.

22. The power panel of claim 21, wherein the plurality of power input connections are located on the front of the chassis.

23. The power panel of claim 21, wherein the plurality of power output connections are located on modules mounted in the chassis.

* * * * *